United States Patent [19]
Takatsu et al.

[11] Patent Number: 5,434,026
[45] Date of Patent: Jul. 18, 1995

[54] EXPOSURE CONDITION MEASUREMENT METHOD

[75] Inventors: Norihiko Takatsu, Tokyo; Kyoichi Suwa, Yokohama; Shinichi Nakamura, Kawaguchi; Hiroaki Hosokawa, Sagamihara; Shigeru Hirukawa, Kashiwa, all of Japan

[73] Assignee: Nikon Corporation, Tokyo, Japan

[21] Appl. No.: 989,909

[22] Filed: Dec. 11, 1992

Related U.S. Application Data

[63] Continuation of Ser. No. 785,233, Nov. 1, 1991, abandoned, which is a continuation of Ser. No. 610,569, Nov. 8, 1990, abandoned.

[30] Foreign Application Priority Data

Nov. 13, 1989 [JP] Japan .................... 1-294590

[51] Int. Cl.$^6$ ................................. G03C 5/00
[52] U.S. Cl. ..................... 430/30; 430/394; 430/396; 430/397
[58] Field of Search ................. 430/5, 22, 30, 394, 430/396, 397

[56] References Cited

U.S. PATENT DOCUMENTS

| | | | |
|---|---|---|---|
| 3,876,303 | 4/1975 | Talts | 430/30 |
| 4,650,983 | 3/1987 | Suwa | 250/204 |
| 4,677,301 | 6/1987 | Tanimoto et al. | 250/548 |
| 4,774,158 | 9/1988 | Vervoordeldonk et al. | 430/394 |
| 4,806,457 | 2/1989 | Yanagisawa | 430/311 |
| 4,900,939 | 2/1990 | Aoyama | 250/548 |
| 4,908,656 | 3/1990 | Suwa et al. | 355/53 |

*Primary Examiner*—Kathleen Duda
*Attorney, Agent, or Firm*—Shapiro and Shapiro

[57] ABSTRACT

In a method for measuring a condition for exposing, at a predetermined energy quantity, a pattern formed on a mask onto a photosensitive substrate on which a resist image is formed on the surface thereof by using an exposing device, first patterns formed at a plurality of positions on the mask are successively exposed onto a plurality of partial regions on the photosensitive substrate while changing said exposure condition. Second patterns are, with overlapping, exposed onto at least a portion of the latent image of said first patterns formed in said partial regions due to said process while changing the exposure condition. A predetermined state where the resist image is formed on the resist layer after the development is detected so that the exposure condition is measured in accordance with the state.

12 Claims, 23 Drawing Sheets

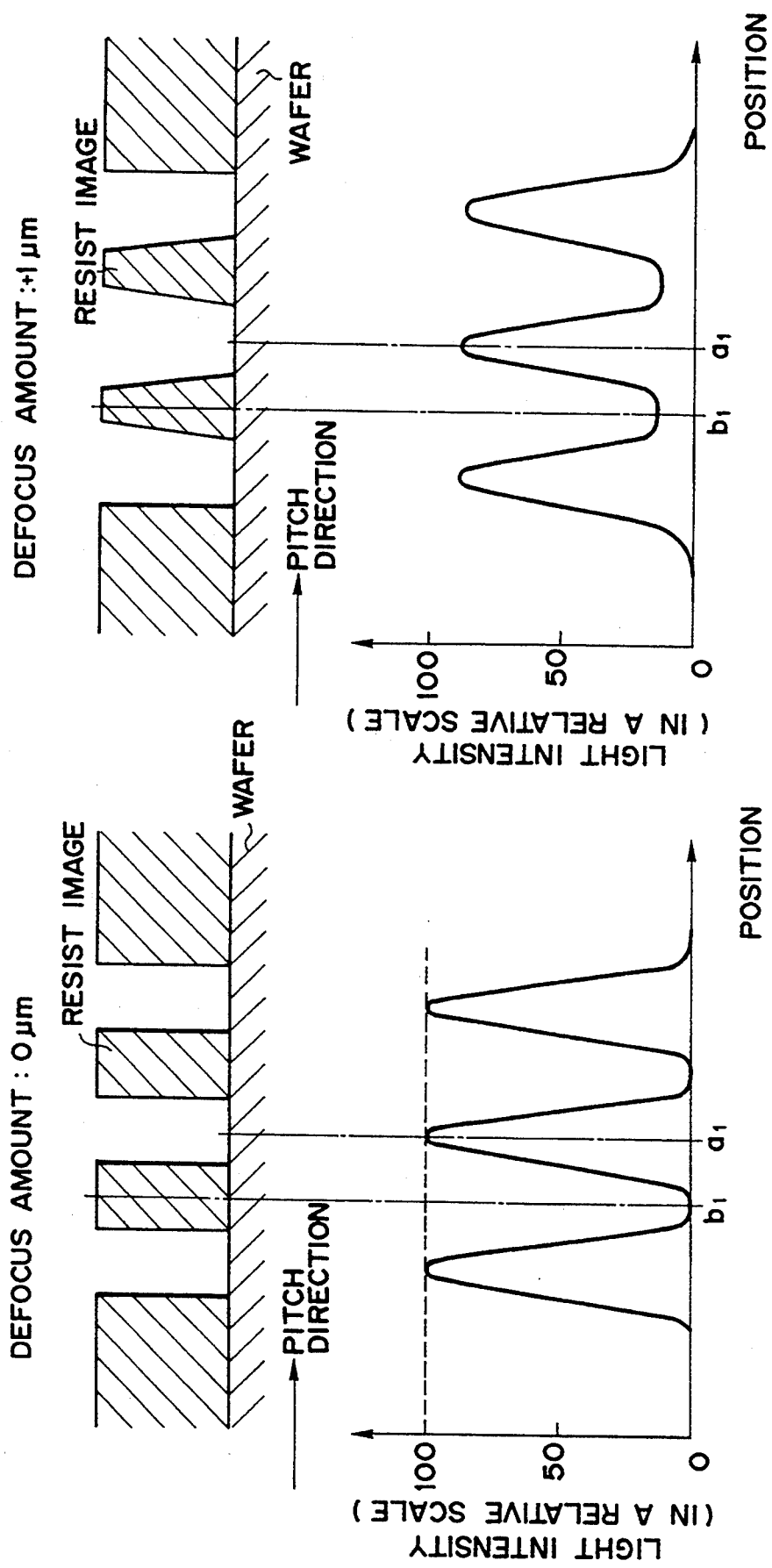

F I G. 4A
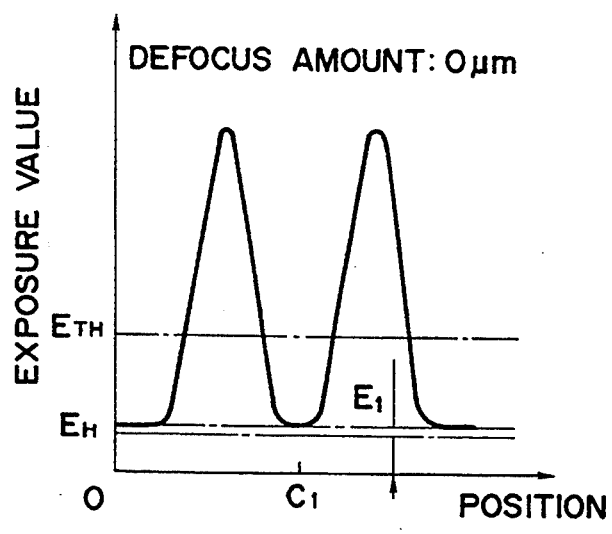
F I G. 4B
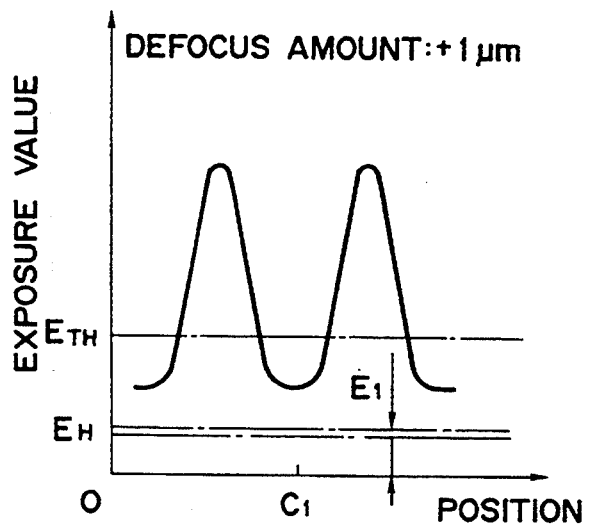
F I G. 4C
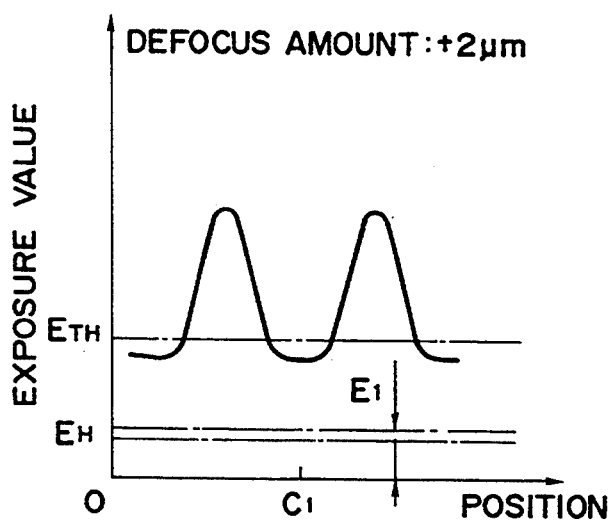

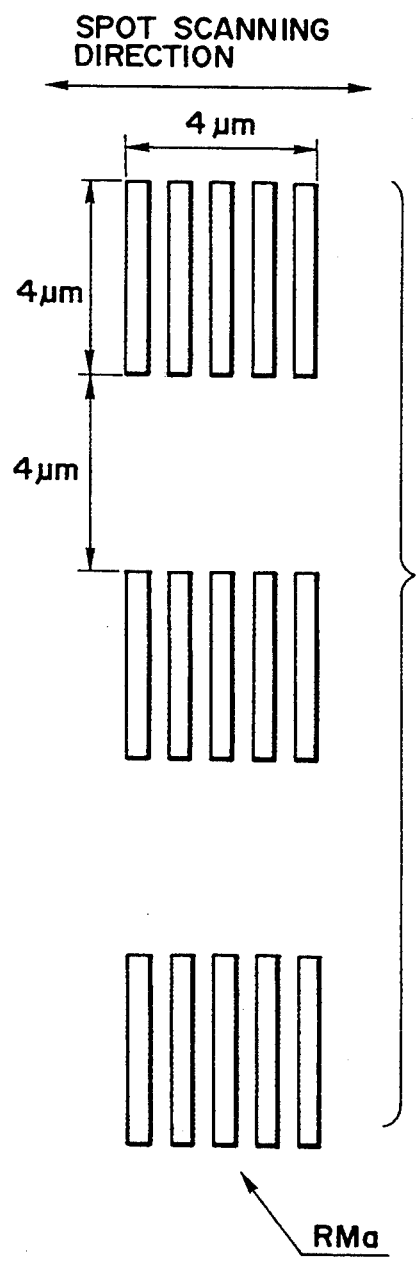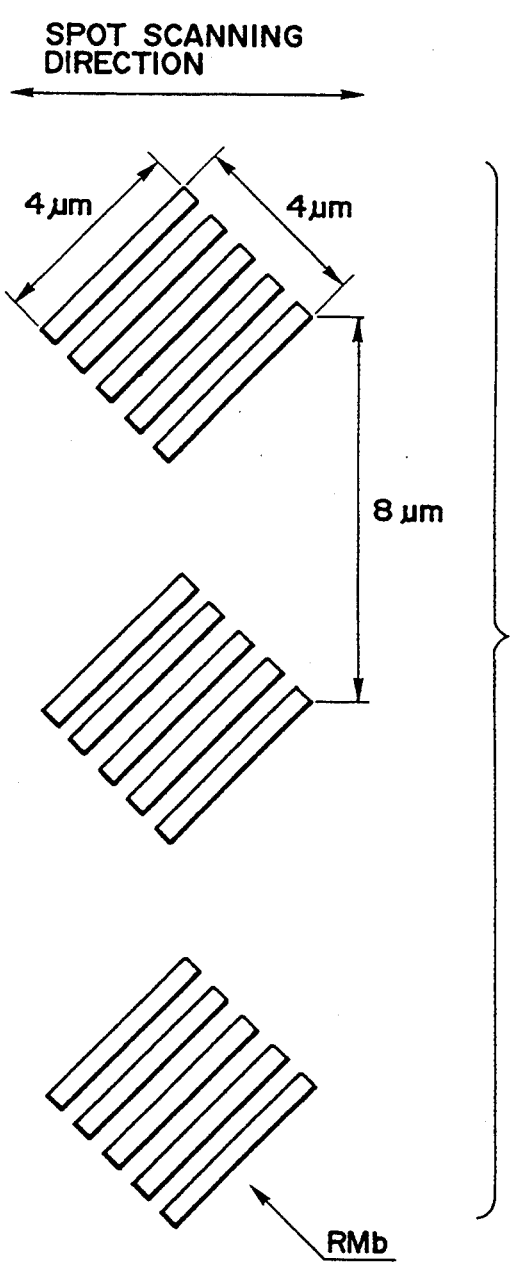

DEFOCUS AMOUNT: 0 μm

DEFOCUS AMOUNT: +1 μm

DEFOCUS AMOUNT: +2 μm

DEFOCUS AMOUNT: 0 μm

DEFOCUS AMOUNT: +1 μm

DEFOCUS AMOUNT: +2 μm

RESIST IMAGE
FIG. 16B
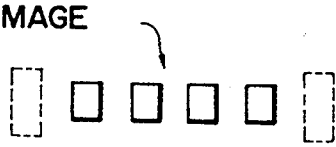
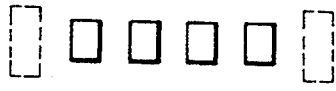
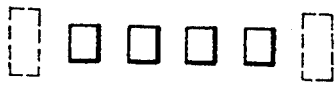
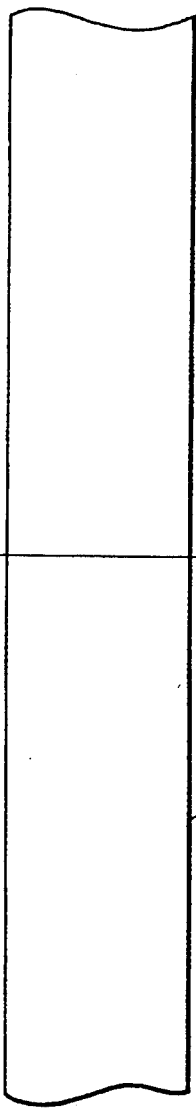
SP
FIG. 16C
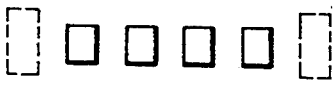
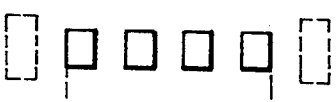
→ Y
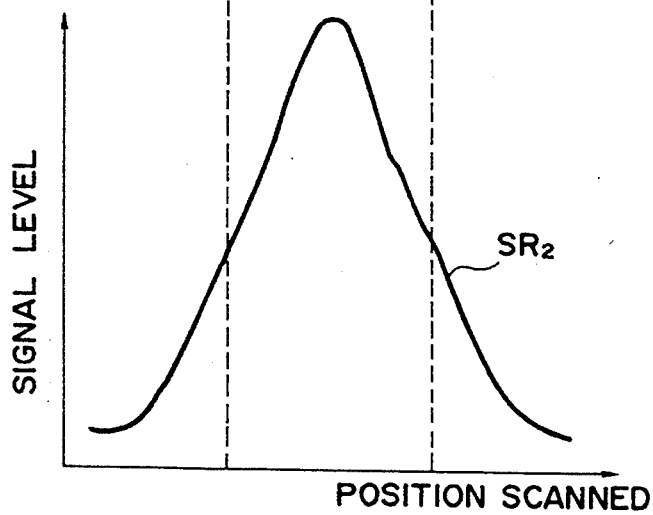
SR₂
SIGNAL LEVEL
POSITION SCANNED

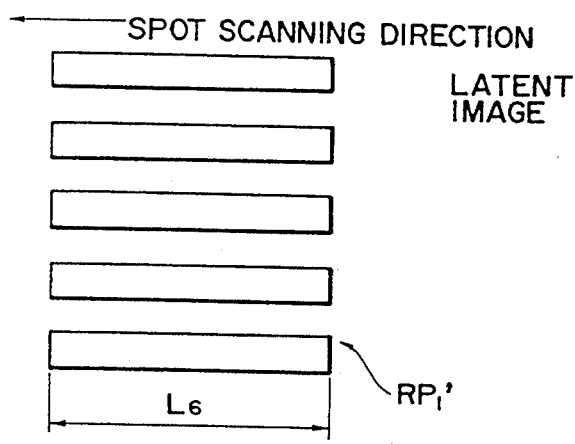
FIG. 17A
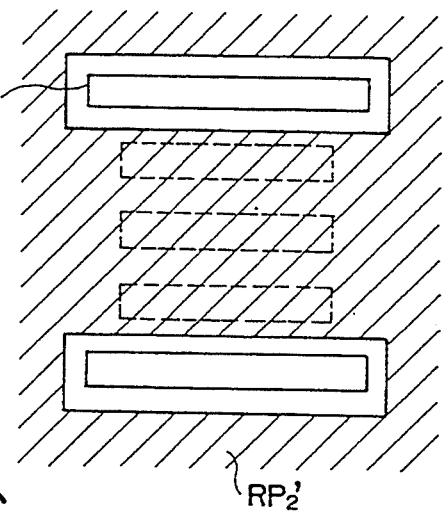
FIG. 17B
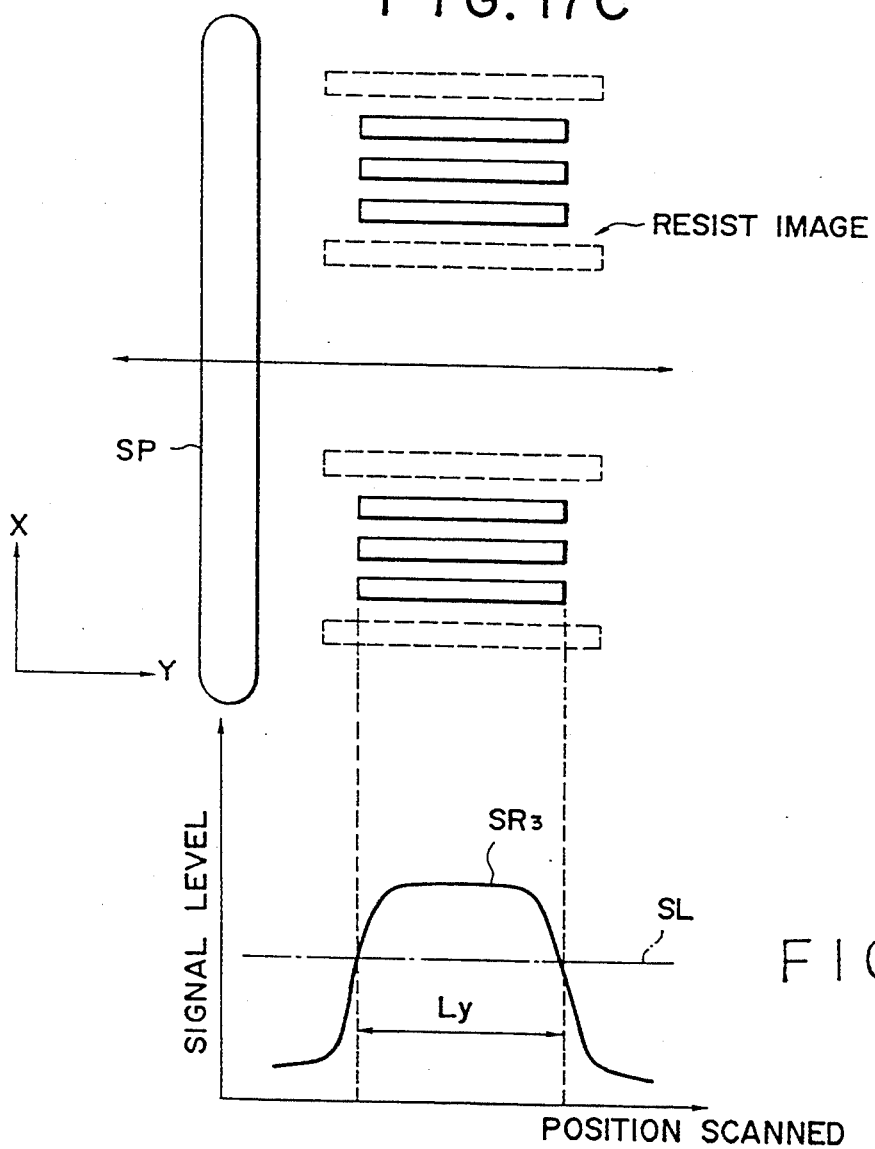
FIG. 17C
FIG. 17D

F I G. 17E
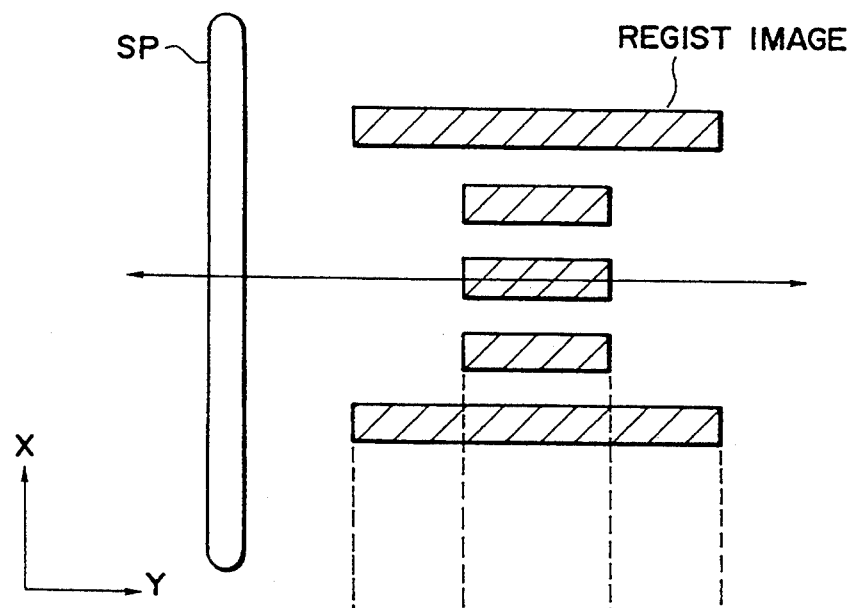
F I G. 17F
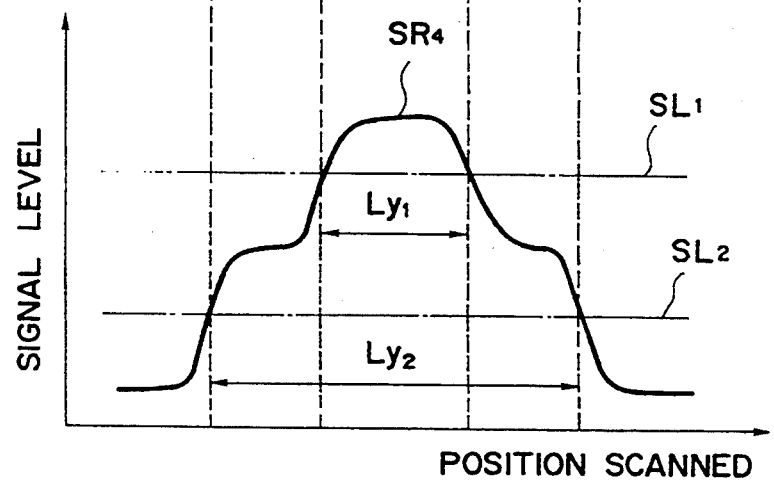

FIG. 18A
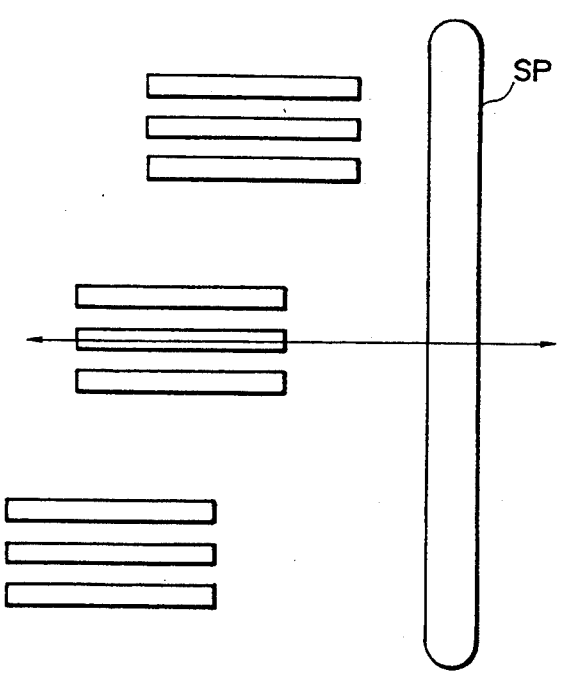
FIG. 18B
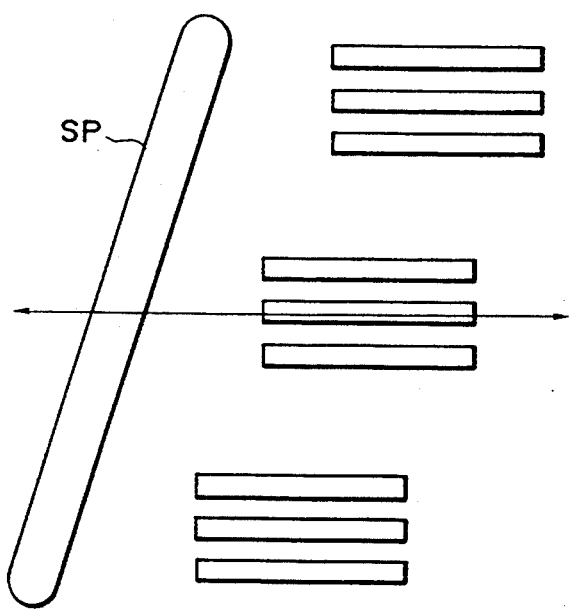
FIG. 18C

EXPOSURE CONDITION MEASUREMENT METHOD

This is a continuation of application Ser. No. 785,233 filed Nov. 1, 1991, now abandoned which is a continuation of application Ser. No. 610,569 filed Nov. 8, 1990, now abandoned.

BACKGROUND OF THE INVENTION

1. Field of the Invention

The present invention relates to a method of determining exposure conditions for an exposure device for manufacturing semiconductor devices or liquid crystal display devices or the like. More particular, the present invention relates to a measuring method capable of preferably determining the focusing condition of a projection type exposure device (an aligner or a stepper or the like).

2. Related Background Art

In a photolithography process necessary to manufacture semiconductor devices, a circuit pattern written on a glass original plate, which is usually called a "reticle", is printed on a resist layer applied on a wafer by a predetermined thickness (about 1 to 2 μm). Then, the resist layer which has not been removed by a development process is arranged to serve as a mask so that the wafer is subjected to a variety of processes including photo-etching. In particular, in the exposure (printing)process, a reduction projection type exposure device (stepper) of a step and repeat type is widely used to serve as a device to transfer the reticle pattern to the wafer while maintaining a high resolution.

A stepper of the type described above is arranged to expose the reticle pattern onto the wafer (the resist layer) via a projection lens after the reticle and the wafer have been accurately aligned to each other. In order to meet a recent desire of manufacturing a densely integrated and precise semiconductor device, the wave length of exposure light has been shortened from 436 nm (g-ray) to 365 nm (i-ray) or to 248 nm (KrF Excimer laser). Furthermore, a projection lens having a large N.A. (Numerical Aperture) has been developed.

At present, there has been realized a practical stepper for manufacturing semiconductor devices which is provided with a projection lens the exposure wave length of which is 436 nm (g-ray), the N.A. of which is 0.54 and the reduction ratio of which is 1/5. Furthermore, it is capable of maintaining the resolving power of a minimum line width of 0.65 μm (3.25 μm on the reticle) in the overall region (15 mm×15 mm) of the exposure field. Furthermore, since the size of the chip has been enlarged because of the realized high integration, the exposure field also is enlarged up to about 20×20 mm.

A projection lens having a large N.A. inevitably has a small depth of focus and encounters a problem in that a so-called film reduction occurs, the film reduction being a problem of a type in which a portion of the resist image is removed due to the development processing depending upon the deviation quantity (the defocus amount) of the surface of the wafer with respect to the best focus position at the exposure. As a result, the image contrast of the resist image will undesirably be deteriorated. If the film reduction occurs in the direction of the thickness of the resist film, the thickness of the resist film will be reduced after the development. Therefore, a disadvantage takes place in the next etching in which the above-described resist image is arranged to server as the mask. That is, the basic layer will be removed (subjected to the etching) even if there is the resist image (mask). In the case where the film reduction takes place in the lengthwise direction of the resist image, the two end portions of the resist image will be removed, causing the length of the pattern to undesirably be reduced.

Since this causes the quality of the manufactured device to be deteriorated, it is a critical factor to know the defocus amount which will not cause the film reduction to occur. That is, in order to obtain a resist image exhibiting high image contrast in the wafer process, that is, in order to obtain a device (semiconductor device) capable of meeting the desired characteristics, it is a critical factor to know the focus range (the depth of focus of a projection lens relating to the film reduction) which will not cause the film reduction to occur, by measuring the focus position on the infocus side (adjacent to the projection lens with respect to the best focus position) and the outfocus side (adjacent to the wafer).

Hitherto, in order to know the focus range which will not cause the film reduction to occur, a method has been employed in which the wafer is developed after a trial printing on to the wafer has been performed. Then, the state of the formed resist image is observed by a scanning type electronic microscope (SEM) or an optical microscope. Specifically, a line and space (L/S) pattern is used in which linear patterns (bar patterns) each of which has a predetermined width are arranged at predetermined pitches. Furthermore, only the focus condition is successively changed by a predetermined quantity (for example, 0.2 μm) under the most suitable quantity of exposure (exposure time) so that it is successively exposed onto the wafer. Thus, the resist image of the L/S pattern formed in the shot region (which corresponds to the exposure field of the projection lens) on the wafer is observed by an ITV camera by using the SEM or the optical microscope after the development. In a particular case in which whether or not the thickness of the resist image is reduced in the direction of the thickness is observed by the SEM, there arises a necessity of making a sample the cross section of which is to be observed in such a manner that the sample (the resist image) is cut in a direction (in the direction of the short side) substantially perpendicular to the lengthwise direction. Then, the position on the in and the outfocus side in which the film reduction has not taken place are detected depending upon the state (the film thickness and length of the pattern and the like) in which the resist image is formed so as to make the focus range thus determined to be the depth of focus of the projection lens relating to the film reduction.

However, the above-described conventional technology raises a problem in that the above-described measurement operation must be repeatedly performed in order to measure the focus ranges in the overall region of the exposure field of the projection lens, for example, the focus range of each of a plurality of points at the field center and around the same. Furthermore, the state in which the resist image has been formed must be observed by using the optical microscope or an exclusive measuring device such as the SEM. As a result, the processing speed cannot be raised satisfactorily.

In addition, in the case where the resist image is observed through the ITV camera by using an optical microscope, the operation for adjusting the focus of the microscope must be performed precisely, causing the operator to perform an excessively exhausting work.

On the other hand, in the case where the exclusive measuring device such as the SEM is used, the resist image can be observed relatively precisely. However, the wafer (formed by cutting so as to have its cross section observed) serving as the sample must be placed in a high vacuum chamber before the resist image is observed. Therefore, it takes an excessively long time to manufacture the sample the cross section of which is to be observed and the operation for handling the exhaust system, causing a problem to arise in that the throughput of the measurement is too low.

In particular, a projection lens having a wide exposure field raises a necessity in that the focus range resolvable in the overall region of the exposure field without the film reduction is easily measured. However, the projection lens of the type described above raises a problem in that the number of the points to be measured in the exposure field is increased (10 to 20 points). Therefore, it has been impossible in terms of labor and time to measure the focus range in the overall region of the exposure field without the film reduction.

SUMMARY OF THE INVENTION

Accordingly, an object of the present invention is to provide a method of accurately and quickly measuring a focus condition without a film reduction in the overall exposure field of a projection lens.

In order to solve the above-described problems, the present invention is arranged in such a manner that a wafer W on which a resist layer is formed on the surface thereof is disposed at the best imaging surface of a projection lens PL. Then, a device for exposing a pattern formed on a reticle R onto the wafer W at a predetermined exposure energy is used so that the exposure condition to the wafer W is measured. First patterns $RM_1$ and $RP_1$ formed at a predetermined plurality of positions on a test reticle TR are exposed (first exposure) onto each of a plurality of different shot regions SA on the wafer W while changing the exposure condition. Second patterns $RM_2$ and $RP_2$ are, with overlapping, exposed (double exposure) onto at least a portion of the latent image of the first pattern formed in the shot region SA on the wafer W while changing the exposure condition for each of the shot regions. Then, the state where the resist image is formed in the resist layer due to the overlap exposure of the first and the second patterns, that is, the existence of the resist image in the shot region for each of the focus positions is detected. Then, the focus range in which the resist image exists is determined to be the depth of focus of the projection lens relating to the film reduction.

According to the present invention, the following two principles are employed.

The first principle is arranged in such a manner that, in the case where the resist image of the first pattern formed by the first exposure encounters a film reduction in the direction of the thickness, the second pattern is, with overlapping exposed (second exposure) onto the latent image of the first pattern formed on the resist layer due to the first exposure while setting the condition about the exposure value. That is, a uniform exposure (to be called a "flood exposure" hereinafter) by a light beam having substantially uniform light intensity distribution is performed. As a result, the resist image of the first pattern to be formed on the resist layer is removed (removed by the development process) by the overlap exposure (double exposure). That is, a principle is utilized, the principle being arranged in such a manner that whether or not the film reduction takes place in the resist image formed by the first exposure is determined depending upon the existence of the resist image formed after the double exposure.

The second principle is arranged in such a manner that, when the L/S pattern is transferred in a defocus state, the contrast of each of residual bar patterns except for two end (two outer patterns) patterns is rapidly deteriorated. Therefore, the length of each of the residual bar patterns is excessively shortened in the lengthwise direction in comparison to the length of each of the bar patterns at the two ends. That is, the second pattern is, with overlapping, exposed (second exposure) onto the latent image of the first pattern formed due to the first exposure. Only the bar patterns at the two ends of the latent images of the first pattern are subjected to the double exposure. At this time, if the lengthwise dimension of the first pattern on the photosensitive plate is set to be the same as the allowable value of the change in the length of the resist image, the resist image vanishes if the allowable value is exceeded. Therefore, whether or not the change in the length of the resist image exceeds the allowable value can be determined in accordance with the existence of the resist image (except for the bar patterns on the two ends) formed after the double exposure.

As a result, the depth of focus relating to the film reduction can easily, accurately and quickly be measured in overall regions of the exposure field without the deterioration in the throughput in a projection optical system even if it has a wide exposure field.

Other and further objects, features and advantages of the invention will be appear more fully from the following description.

BRIEF DESCRIPTION OF THE DRAWINGS

FIGS. 1A to 1C, FIG. 2, FIGS. 3A to 3C, FIGS. 4A to 4C, and FIGS. 5A to 5C illustrate the principle of the first embodiment of the present invention;

FIGS. 11A to 11D illustrate a modification of the first pattern according to the first embodiment;

FIGS. 16A to 16C illustrate the measurement operation according to the second embodiment of the present invention;

FIGS. 17A to 17F illustrate the measurement operation according to the modification to the second embodiment of the present invention;

FIGS. 18A to 18C illustrate an example of the relationship between the lengthwise direction of the spot light of an LSA system and the configuration direction of the resist image;

DETAILED DESCRIPTION OF THE PREFERRED EMBODIMENTS

Figure 6:
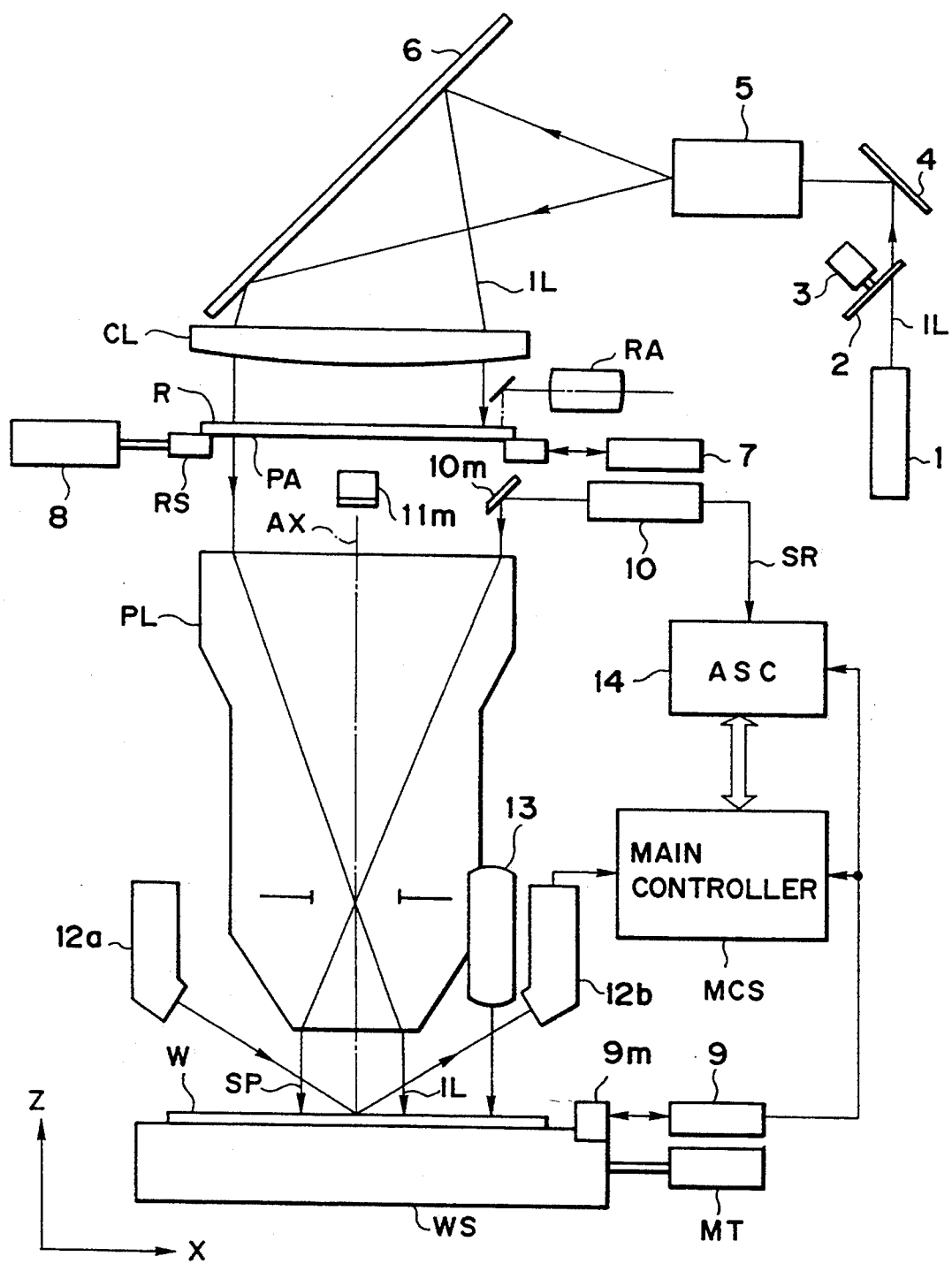
FIG. 6 is a plan view which illustrates the schematic structure of a stepper according to the first to third embodiments of the present invention.

FIG. 6 is a plan view which illustrates the schematic structure of a stepper to which a method according to a first embodiment of the present invention is preferably applied. An illumination device 1 arranged to comprise an extra-high pressure mercury lamp serving as the exposure illumination light source emits illumination light IL of a wavelength (exposure wave length) such as the g-ray and i-ray capable of sensitizing a resist layer. The illumination light IL passes through a shutter 2 (for example, a rotary shutter having four blades) for controlling the exposure quantity. Then, it is made incident upon an illumination optical system 5 having an optical integrator (fly eye lens) and a variable blind and the like (omitted from illustration) via a mirror 4. A drive portion 3 acts to rotate the shutter 2 so that a predetermined exposure quantity (exposure dose) can always be obtained by controlling the time in which the shutter 2 is opened assuming that the intensity of the light emitted from the illumination device 1 is substantially constant.

The illumination light IL, the illuminance of which has been equalized and the beam of which has been made by the illumination optical system 5, is made incident upon a condenser lens CL after it has been reflected by a full-reflecting mirror 6 so that it illuminates, at the equal illuminance, a pattern region PA of a reticle R placed on a reticle stage RS. The reticle R is finely two dimensionally (rotation included) moved in the horizontal plane by a drive portion 8. Its position is always detected by a laser interference meter 7 at a resolution of, for example, about 0.02 $\mu$m. The reticle R is initialized by slightly moving the reticle stage RS in response to a mark detection signal supplied from a reticle alignment system RA for photoelectrically detecting an alignment mark (omitted from illustration) positioned around the reticle.

The illumination light IL, which has passed through the pattern region PA, is made incident upon a both side (or a one side) telecentric projection lens PL having an exposure field having a size of, for example, 20×20 mm. The projection lens PL projects an image of a circuit pattern formed on the pattern region PA on to a wafer W on which a positive type resist layer has been formed. The wafer W is placed on a wafer stage WS via a wafer holder ($\theta$-table, omitted from illustration), the wafer stage WS being two-dimensionally moved in X and Y directions in a step and repeat method by a drive portion MT. Furthermore, it is arranged to slightly move in the direction (direction Z) of the optical axis of the projection lens PL. The X and Y directional positions of the wafer stage WS are, by a laser interference meter 9, always detected at a resolution of, for example, about 0.02 $\mu$m. A movable mirror 9m for reflecting a laser beam transmitted from a laser interference meter 9 is secured at an end portion of the wafer stage WS.

Figure 7A:
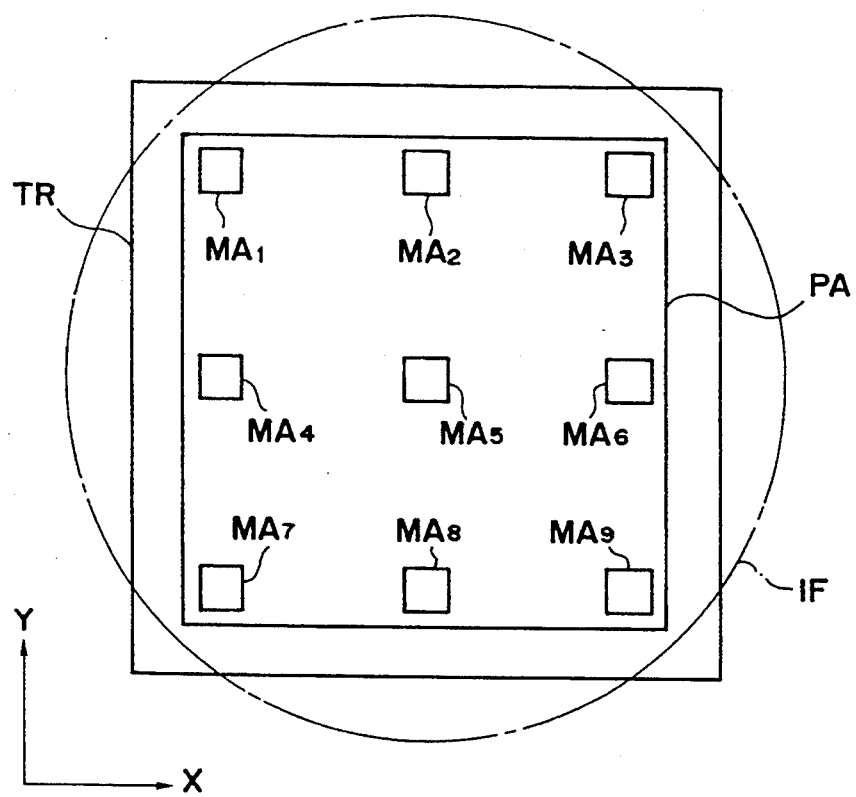
FIG. 7A illustrates a pattern of a test reticle according to the first embodiment of the present invention.

FIG. 7A illustrates an example of the pattern of a test reticle TR which can preferably be used in this embodiment. An exposure field IF (the pattern region PA) has mark regions at a plurality of positions at the center of the reticle and the portion around it, for example, mark regions $MA_1$ to $MA_9$ at corresponding 9 places in a 3×3 configuration (at the center, four corners and the center of each of the four sides). Each of the mark regions $MA_1$ to $MA_9$ has at least a pair of an L/S pattern (a first pattern) $RM_1$ and a light transmissive portion (a second pattern) $RM_2$ having a size which is larger than that of the first pattern $RM_1$ and therefore capable of covering the entire surface of the first pattern $RM_1$.

Figure 7B:
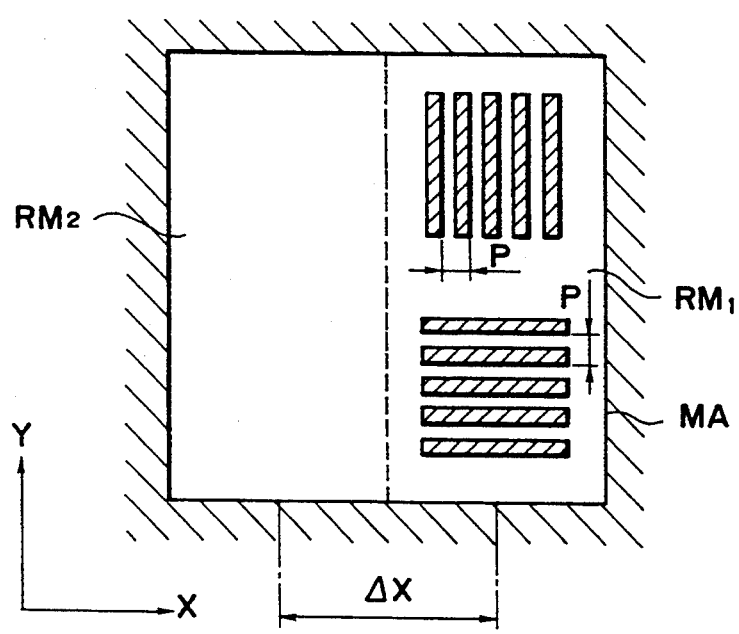
FIG. 7B illustrates the schematic structure of first and second patterns according to the first embodiment of the present invention.

FIG. 7B illustrates the schematic structure of the first and second patterns $RM_1$ and $RM_2$. The first pattern $RM_1$ has five bar patterns arranged in the directions X and Y respectively at a pitch P. Two pairs of the thus arranged L/S patterns are arranged in the direction Y. The pitch P of the first pattern $RM_1$ may be the pitch corresponding to the depth of focus relating to the film reduction and desired to be measured, for example, corresponding to the desired resolving power (the resolution line width) of the projection lens or to the minimum line width of the device pattern. According to this embodiment, the pitch P is set to 6 $\mu$m (1.2 $\mu$m on the wafer W), that is, the line width of the bar pattern is 3 $\mu$m (0.6 $\mu$m on the wafer W) in consideration of the resolving power of the projection lens PL. Furthermore, either of two transparent openings formed by, as designated by a dashed line, imaginarily dividing the mark region MA in the direction X is arranged to serve as the second pattern $RM_2$.

According to this embodiment, the wafer stage WS is shifted by $\alpha \cdot \Delta X$ in the direction X at the second exposure operation with respect to each of the stepping positions in the first exposure operation in consideration of reduction ratio $\alpha$ of the projection lens PL and the distance $\Delta X$ between the first pattern $RM_1$ and the second pattern $RM_2$. As a result, the projected image of the second pattern $RM_2$ is made correctively to overlap with the latent image of the first pattern $RM_1$ formed on the resist layer at the first exposure operation for each of the shot regions so that the flood exposure is performed. Although the second pattern $RM_2$ shown in FIG. 7B is used at the second exposure operation, it may be omitted from the structure. For example, the reticles may be interchanged so as to use a reticle (nonprocessed glass) on which no circuit pattern is formed. As an alternative to this, a structure may be employed in which the reticle is removed so as to perform the exposure without the reticle and the entire surface of the shot region SA is, as well as the latent image of the first pattern $RM_1$, subjected to the flood exposure process.

A stepper of the type described above has an alignment sensor provided for the purpose of detecting a variety of patterns (alignment mark or the like) formed on the wafer W. According to this embodiment, a laser step alignment (LSA) system of a TTL system is, as disclosed in U.S. Pat. No. 4,677,301, is provided which is arranged in such a manner that slit-shape spot light is, on the wafer W via the projection lens PL, formed substantially in parallel to the diffraction mark. Furthermore, optical information emitted from the mark due to stage scanning, more particularly, diffraction light and diffusion light are again extracted via the projection lens PL. In order to simply if the description here, only an LSA system (Y-LSA system) 10 for detecting the Y-directional position is illustrated in FIG. 6. As for an X-LSA system, only a mirror 11m which corresponds to the mirror 10m for the Y-LSA system 10 is illustrated. Spot light beams emitted from the X and Y-LSA systems intersect perpendicularly with each other in an exposure field IF so that spot light extending in the X and Y directions toward an optical axis AX is formed at positions distant from the optical axis AX on the axes X and Y by a predetermined distance.

The Y-LSA system 10 transmits a photoelectric signal SR which corresponds to the intensity of the diffraction light (or diffused light) to an alignment signal processing circuit (to be called an "ASC" hereinafter) 14 at which the Y-directional scanning position of the mark is detected in accordance with the waveform which corresponds to the profile of the mark. At this time, the ASC 14 subjects the photoelectric signal SR to sampling in synchronization with an up/down pulse generated by the laser interference meter 9 at each unit movement quantity (0.02 μm) of the wafer stage WS. Each of the values of the results of the sampling is converted into a digital value so as to have it stored in the memory in accordance with the sequential order of the addresses. Then, the scanning position of the mark is detected by a predetermined calculation. When the wafer surface is subjected to relative scanning with the spot SP emitted from the Y-LSA system 10, a resist image (a stepped edge created due to small projections and pits of the resist layer) must exist on the wafer W in order to generate the diffraction light. Therefore, according to this embodiment, the Y-LSA system 10 and the ASC 14 are employed so as to determine whether or not there is light (diffraction light) returned from the wafer W, that is, the output (photoelectric signal SR) from the photoelectric detector. As a result, the existence of the resist image is automatically measured.

FIG. 6 also illustrates an off-axis type alignment (FIA: Field Image Alignment) system 13 which is mechanically secured at a predetermined interval from the projection lens PL and which is arranged to observe the alignment mark in an enlarged manner by using an imaging device such as the ITV or the CCD camera or the like. The FIA system 13 observes both an indication mark of an indication plate (the reticle) disposed in conjugation with the wafer W and the alignment mark. The FIA system 13 detects, in accordance with the waveform of the image signal supplied from the imaging device, the deviation of the mark image from the indication mark so as to transmit information about the detected central position of the mark of the FIA system 13 when the mark image has been positioned at the center of the indication mark.

The stepper further comprises a projection optical system 12a which diagonally (5° to 20° with respect to the wafer surface) emits light, to which the resist layer is nonsensitive, to the wafer W. The stepper further comprises a parallel flat glass (parallel plane). Furthermore, the stepper has a diagonally incidental light system focal point detection system (AF sensor) 12 which comprises a light receiving optical system 12b for receiving the beam reflected from the wafer W. The structure and the like of the AF sensor 12 has been disclosed in, for example, U.S. Pat. No. 4,650,983. The AF sensor 12 detects the Z-directional deviation amount (defocus amount) of the wafer surface from the surface (the best imaging surface) on which the reticle pattern can be imaged while exhibiting the best contrast. As a result, the AF sensor accurately makes the best imaging surface and the wafer surface (resist surface) align with each other. In consideration of the thin film interference of the resist layer or the like, it is preferable that the illumination light be multiwave laser or white light.

According to this embodiment, the calibration of the AF sensor 12, that is, the angle adjustment of the parallel plane for the purpose of making the best imaging surface to be the reference zero point is not performed. Therefore the AF sensor 12 detects the Z-directional movement of the wafer W while making the designed best focus position to be the reference zero point. By using the AF sensor 12 thus arranged, the offset amount of the focus condition is successively changed, that is, the quantity of the Z-directional shifting of the wafer W is successively set.

The stepper (see FIG. 6) thus constituted is connected to a coater developer (omitted from illustration) in an in-line manner, the coater developer comprising a variety of processing units such as a resist coating device and a development device. As a result, a lithography system to which the method according to this embodiment can preferably be applied is constituted. A lithography system of the type described above has been disclosed, for example, in U.S. Pat. No. 4,900,939 in which a sub-conveyance device is individually provided from a main conveyance device which successively conveys the wafer W in a sequential order: a resist application process, an exposure process, and a development process. The sub-conveyance device is capable of conveying the wafer W, which is being conveyed or positioned in a processing unit, to an optional position. As a result, the wafer W developed by the coater developer can immediately be returned to the stepper body so that the observation of the resist image and various measurements can be performed by using the alignment sensor (LSA system or the like).

A main controller MCS sets a variety of processing conditions (such as the development conditions) and controls the wafer which is conveyed in the system. Furthermore, the main controller MCS calculates the focus conditions of the stepper in accordance with information denoting the state in which the resist has been formed and supplied from the AF sensor 12. In addition, the main controller MCS controls the overall operation of the stepper (the lithography system) including the above-described Y-LSA system 10 and the FIA system 13.

Now, the principle according to the first embodiment of the present invention will be described with reference to FIGS. 1 to 5. The description will be made about a case in which the L/S pattern having a predetermined line width is exposed to a positive type resist on a silicon wafer.

Figure 1C:
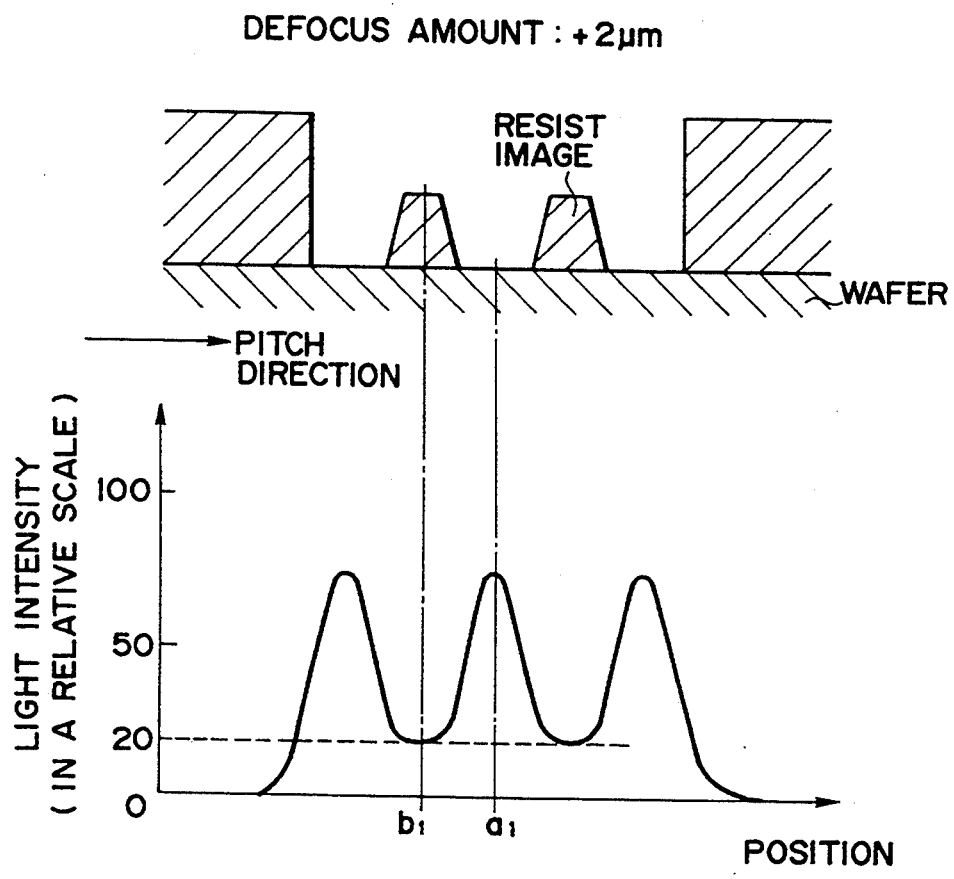

FIG. 1 is cross sectional view in the direction of the pitch which illustrates the resist image obtainable after the development when the L/S pattern exposure is performed at the most suitable exposure value while changing only the focus conditions. FIG. 1 also illustrates the light intensity (exposure value) distribution on that cross section. In order to simplify the description, each of the focus conditions shown in FIGS. 1A to 1C is set in such a manner that the defocus amount is 0 μm (best focus), +1 μm and +2 μm (letting the infocus side be positive). In addition, the axis of ordinate of each of the drawings stands for the relative light intensity assuming that the light intensity at the best focus is 100.

Since the positive type resist has a characteristic in that its portion (for example, position $a_1$ in the drawing) of the resist layer exposed to light displays a good solubility, that resist layer is removed by a development process. As a result, the portion (for example, position $b_1$ in the drawing) of the resist layer, which has not been exposed to light, is left. Therefore, at the best focus position, the ratio of the portion in which the resist layer exists and the portion from which the same has been removed becomes 1:1 as shown in FIG. 1A. Furthermore, the film reduction (in the direction of the thickness) does not take place at the top end portion of the resist layer so that an ideal resist image is formed.

On the contrary, in the case shown in FIG. 1C, the contrast of the projected image is deteriorated by a degree which corresponds to the defocus amount (+2 $\mu$m). Therefore, since the light intensity (the relative value) at the position $b_1$ shown in FIG. 1A is zero, that at the position $b_1$ shown in FIG. 1C becomes about 20. As can be understood from this, the position $b_1$ becomes bright (that is, it is exposed to light). As a result, since the resist layer at position $b_1$ has the solubility, the film reduction occurs at the top portion of the developed resist image. Also the light intensity at position $b_1$ is not zero in the case shown in FIG. 1B similarly to the case shown in FIG. 1C, but film reduction is not generated at the top portion of the resist image. Therefore, it can be understood that the defocus amount (+1 $\mu$m) shown in FIG. 1B is the commencement position of the film reduction on the infocus side.

Figure 2:
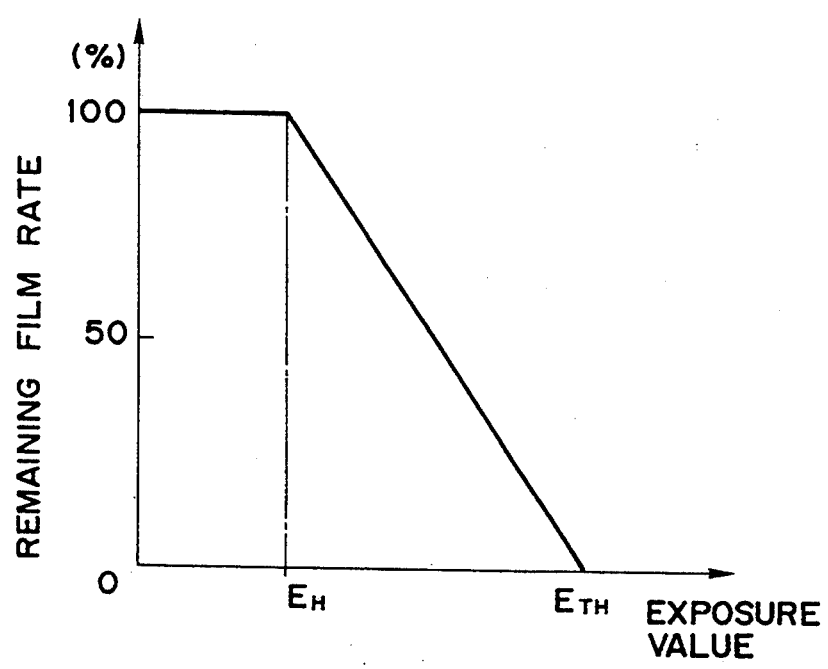

FIG. 2 illustrates an example of the sensitivity characteristics of the positive type resist applied to the surface of the silicon wafer. A resist sensitivity characteristics graph shows the residual film rate with respect to exposure value E (light intensity) after the flood exposure has been performed. FIG. 2 illustrates a fact that the film reduction of the resist image commences at exposure value $E_H$ and the resist layer can be perfectly removed at exposure value $E_{TH}$. Therefore, if the exposure value distribution at the pattern exposure shown in FIG. 1 can be detected, the state where the resist image of the L/S pattern formed on the resist layer has been formed, that is, whether or not the film reduction has occurred can be estimated by making the above-described distribution and the resist sensitivity characteristic graph correspond to each other.

Now, the above-described operation will be described in detail with reference to FIGS. 3 to 5. FIG. 3 illustrates the distribution of the exposure value generated in the direction of the pitch of the resist layer when the L/S pattern is exposed at exposure value $E_0$ while varying the focus conditions. FIGS. 4 and 5 illustrate the distribution of the exposure value generated in the direction of the pitch of the resist layer when the L/S pattern is exposed (first exposure) at exposure value $E_0$ while varying the focus conditions before the latent image thus formed is subjected to a flood exposure (second exposure) at exposure values $E_1$ and $E_2$ (where $E_H < E_1 < E_2$). In any of the states shown in FIGS. 3 to 5, the focus conditions are arranged in such a manner that the defocus amount is set to 0, +1 and +2 $\mu$m, respectively. In addition, the axis of ordinate stands for the exposure value and the axis of abscissa stands for the pitch-directional position, the axis of ordinate further standing for the exposure value $E_H$ at which the resist layer shown in the resist sensitivity characteristics graph (FIG. 2) commences the film reduction and exposure value $E_{TH}$ at which the resist layer can be perfectly removed.

Figure 3A:
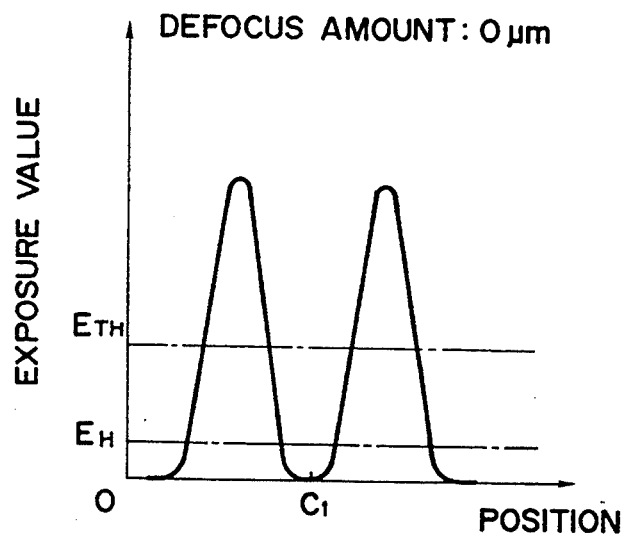
Figure 3B:
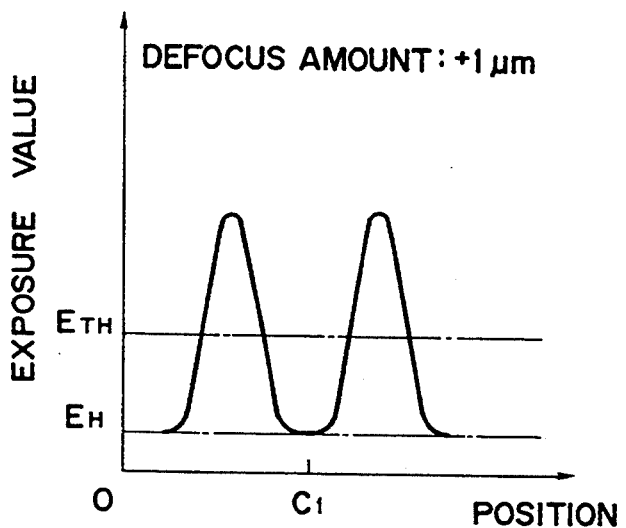
Figure 3C:
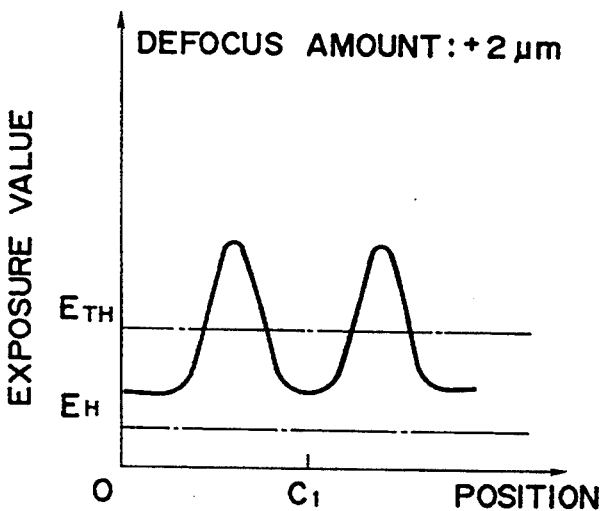

Since the defocus amount is 0 $\mu$m (best focus) in the case shown in FIG. 3A, the exposure value $E_{min}$ ($E_{min} \simeq 0$) is lower than $E_H$, the exposure value $E_{min}$ being the exposure value in the portion (which corresponds to the light shielded portion of the L/S pattern, for example, position $C_1$ in the drawing) at which the exposure value becomes minimum in the resist layer. Therefore, it can be understood that the film reduction in the resist image can be prevented. On the other hand, since the exposure value $E_{min}$ at the position $C_1$ is $E_{min} \simeq E_H$ in the case shown in FIG. 3B, the defocus amount (+1 $\mu$m) is the limit focus condition at which the film reduction does not take place on the infocus side. In addition, in the case shown in FIG. 3C, the exposure value $E_{min}$ at the position $C_1$ becomes $E_H < E_{min} < E_{TH}$ and the same is a substantially intermediate value between $E_H$ and $E_{TH}$. Therefore, it can be estimated that the resist layer encounters the film reduction to a degree which is half of its film thickness in the direction of the thickness.

Figure 5A:
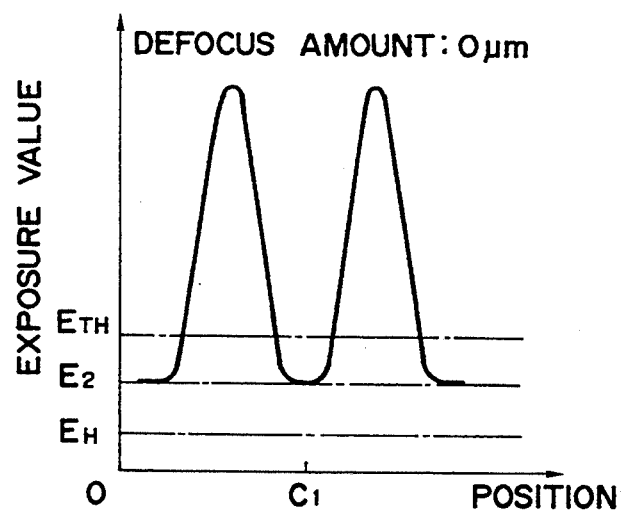
Figure 5B:
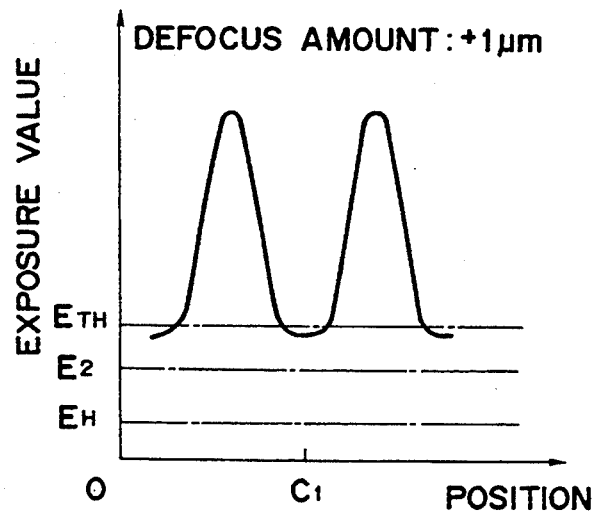
Figure 5C:
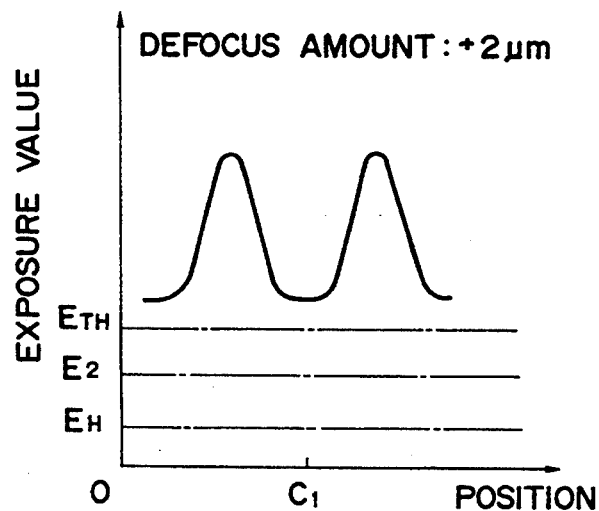

In the case shown in FIG. 4, the latent image of the L/S pattern is subjected to the second exposure at the exposure value $E_1$. Therefore, the exposure value $E_1$ is, as the offset, added to the resist layer of the overall surface of the shot region on the wafer, for example, the resist layer in the portion (position $C_1$) at which the exposure value at the first exposure becomes the minimum value. Therefore, the exposure value $E_{min}$ ($E_{min} \simeq E_1$) at the position $C_1$ exceeds $E_H$ in the case shown in FIG. 4A so that a resist image which was slightly reduced is formed. In the case shown in FIG. 4B, the exposure value $E_{min}$ holds the relationship $E_H < E_{min} < E_{TH}$ and the same is an intermediate value between $E_H$ and $E_{TH}$. Therefore, it can be estimated that the resist image is reduced to half of its film thickness. In the case shown in FIG. 4C, since the exposure value $E_{min}$ is slightly smaller than $E_{TH}$, it can be estimated that a slight quantity of the resist layer is left. It can be considered that the cases shown in FIG. 5 are the same as the above-described cases shown in FIG. 4. In the case shown in FIG. 5A, the resist layer film thickness is halved, in the case shown in FIG. 5B, a slight quantity of the resist layer is left and in the case shown in FIG. 5C, the resist layer is perfectly removed.

Therefore, whether the film reduction of the resist image formed by the first exposure (pattern exposure) has taken place can be determined in accordance with only the existence of the resist layer after the second exposure by properly selecting the exposure value at the second exposure (flood exposure). That is, the defocus amount (focus position) at which the film reduction commences can be detected in accordance with the existence of the resist image. According to this embodiment, the exposure conditions at the first exposure must, of course, be set to the most suitable conditions in order to detect the focus condition which relates to the film reduction.

This embodiment employs the above-described principle in such a manner that the first exposure (pattern exposure) and the second exposure (flood exposure) are performed while changing the focus conditions. Then, the existence of the resist image formed due to the development process is detected. As a result, the depth of focus (the focus range with which the film reduction does not commence) relating to the film reduction can be obtained from the above-described focus range in which the resist image exists.

Now, the measuring method according to this embodiment will be described. According to this embodiment, exposure value $E_{1st}$ (the most suitable exposure value) at the first exposure and the depth of focus at a point in the exposure field, for example, at the exposure field center are assumed to be obtained previously, the depth of the focus being related to the film reduction.

As a method of measuring the most suitable exposure value $E_{1st}$ in the stepper, there has been a known method which is arranged in such a manner that a test reticle TR is printed to the wafer W on trial before the wafer W is developed. Then, the line width of the bar pattern is measured by an optical microscope or an exclusive line width measuring device so as to be subjected to a comparison with the designed line width. Therefore, the description about it is omitted here. As disclosed in U.S. Pat. No. 4,908,656, another method may be employed which is arranged in such a manner that a wedge-shape mark is used so as to determine the most suitable exposure value, the wedge-shape mark having a change of sensitivity in the lengthwise direction several tens times the quantity of the change in the line width of the bar pattern due to the change in the exposure value. On the other hand, as for the depth of focus relating to the film reduction at the exposure field center, a method may be employed which is arranged in such a manner that, for example, the L/S pattern is printed to the wafer W on trial before the film reduction of the resist image under each of the focus condition is observed so that the depth of focus (assumed to be 1.0 $\mu$m according to embodiment) relating to the film reduction is determined.

Now, a method of measuring the depth of focus relating to the film reduction in the overall region of the exposure field, that is, at each of the measurement points in the field which correspond to the mark regions $MA_1$ to $MA_9$ of the test reticle TR will be described with reference to FIGS. 8 to 11. In the stepper shown in FIG. 6, the main controller MCS transfers (first exposure) the projection image of the test reticle TR on to the wafer W in the shape of a matrix by the step and repeat method while changing only the focus condition (the level of the wafer) and making the exposure value to the predetermined most suitable exposure value $E_{1st}$. As a result, the latent image of the first pattern $RM_1$ is formed in each of the shot regions SA of the resist layer. Then, the wafer stage WS is shifted by $\alpha.\Delta X$ in the direction of X with respect to each of the stepping positions at the first exposure so as to make the projection image of the second pattern $RM_2$ with the latent image of the first pattern $RM_1$. During this, each of the shot regions SA formed, in the form of a matrix, on the wafer W is subjected to the flood exposure (double exposure) as the second exposure while changing at least either the exposure value $E_{2nd}$ or the focus position f.

As an alternative to the structure in which the wafer stage WS is shifted by $\alpha.\Delta X$ in the direction of X at the second exposure, another structure may be employed which is arranged in such a manner that the test reticle TR is shifted by $\Delta X$ in the direction X while monitoring its position with a laser interference meter 7 after the first exposure. According to this structure, the necessity of correcting (shifting) the stepping position at the second exposure can be eliminated. The first and the second exposure are, of course, arranged to have the same focus position f in each of the shot regions SA. In addition, the exposure value $E_{1st}$ is made a constant value, that is, the most suitable exposure value and only the focus condition is changed in the first exposure. In the second exposure, the exposure value $E_{2nd}$ is changed as well as the focus condition. Therefore, the structure is arranged in such a manner that a plurality (m times here) of exposure operations are performed under the same focus condition in the first exposure in order to provide an offset of the exposure value at the second exposure.

Figure 8:
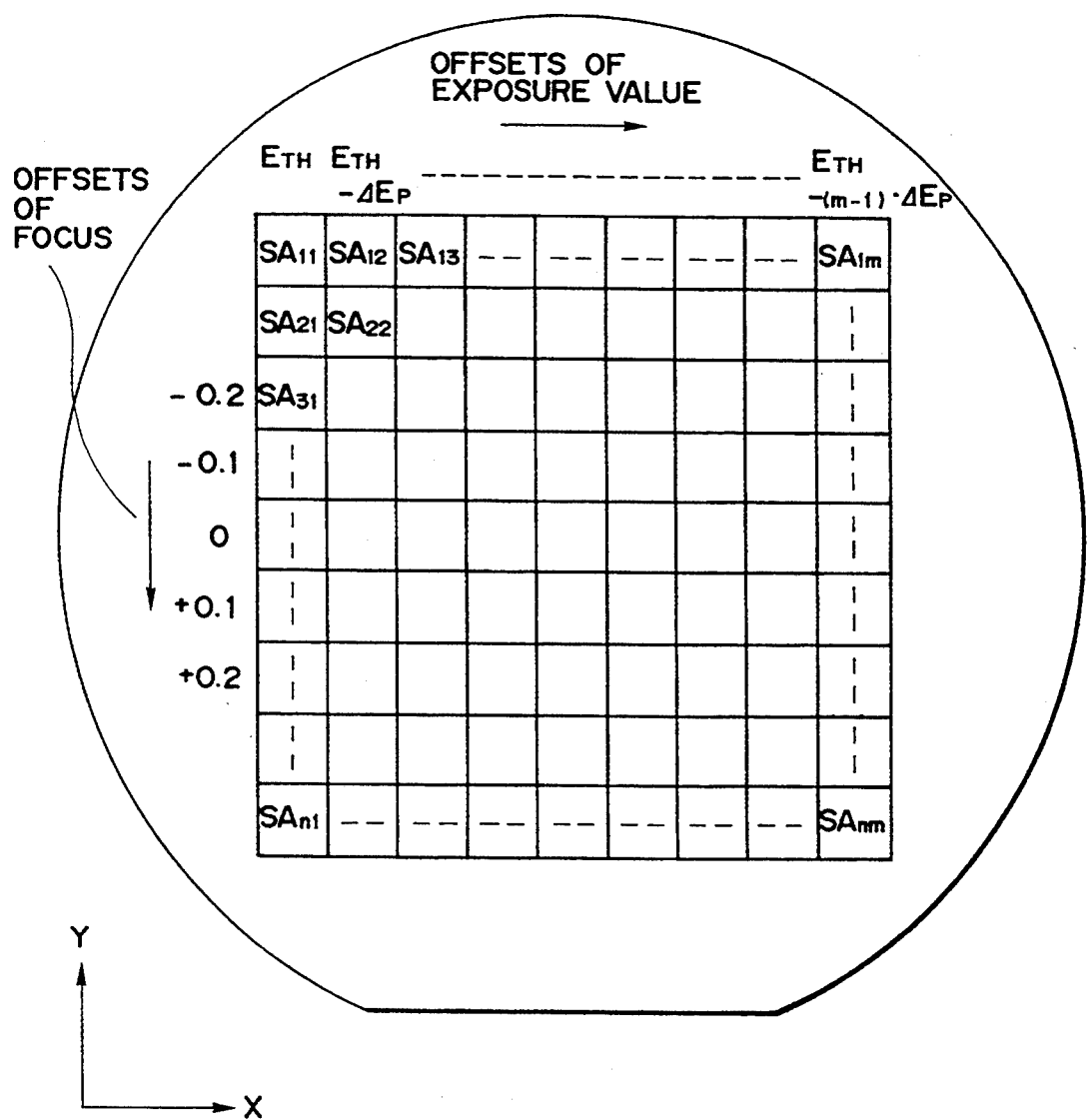
FIG. 8 illustrates the shot configuration on the wafer which has been subjected to a double exposure for determining the exposure condition according to the first embodiment of the present invention.
Figure 9:
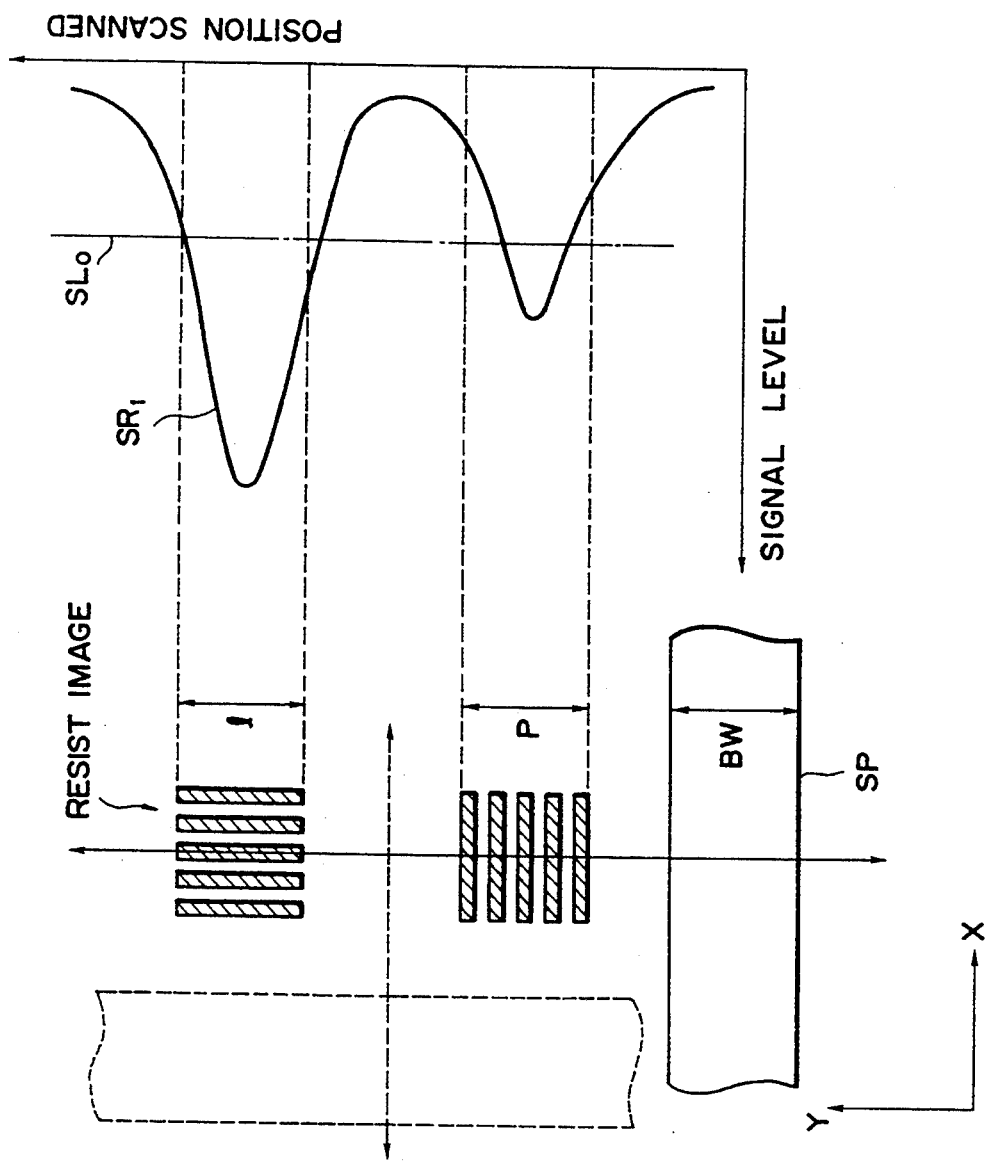
FIGS. 9A and 9B illustrate the measurement operation according to the first embodiment of the present invention.

As shown in FIG. 8, in the second exposure, the flood exposure is performed while changing the exposure condition for each of the shot regions SA provided on the wafer W in the directions X and Y, for example, in the form of an m×n matrix. In each of the shot lines extending in the direction X (for example m shot regions $SA_{n1}$ to $SA_{nm}$) of the matrix shot configuration, a predetermined offset $\Delta Ep$ is given to the second exposure value $E_{2nd}$ while maintaining the focus position f at a constant position. Specifically, the second exposure value is made to be $E_{2nd}=E_{TH}-i.\Delta Ep$ ($i=0, 1, \ldots, m-1$). In this state, the time in which the shutter 2 is opened is controlled by the drive portion 3 shown in FIG. 6 in order to perform the flood exposure by the exposure value obtained from m short regions. Then, the exposure time is, in accordance with the X-directional shot position, successively changed by, for example 10 msec (which corresponds to the offset amount $\Delta Ep$). Referring to FIG. 8, the exposure time is successively shortened by 10 msec from left to right of the X-directional shot configuration. However, $E_{TH}$ is the exposure amount with which the resist layer on the wafer can be perfectly removed as described in the graph (FIG. 2) which illustrates the resist sensitivity characteristics.

On the other hand, in each of the shot lines (for example n shot regions $SA_{1m}$ to $SA_{nm}$) extending in the direction Y of the shot configuration shown in FIG. 8, the focus position f is given a predetermined offset $\Delta f$ while maintaining the second exposure value $E_{2nd}$. Specifically, the wafer stage W is slightly moved in the direction Z by a drive portion 9 while monitoring the focus position f by the AF sensor 12. In a range of distance ± several micromillimeters from the designed best focus position (the reference zero position of the AF sensor 12), the focus position f is successively changed from outfocus side to the infocus side by, for example, 0.1 $\mu$m (offset amount $\Delta f$) in accordance with the Y-directional shot positions (from the upper portion to the lower portion of the shot configuration). Referring to FIG. 8, the focus condition at the central shot in the Y-directional shot configuration is set to the best focus position and the offset amounts (the defocus amount) are successively set by +0.1 and -0.1 $\mu$m in the lower and the upper directions of the shot configuration with respect to the above-described central shot.

The wafer W which has been subjected to the double exposure as described above is subjected to a development process by a coater developer which is connected to the stepper in an in-line manner. Then, it is again conveyed to the stepper so as to be placed on the wafer stage WS. Then, the main controller MCS introduces the wafer W to the mark detection position (spot forming position) of the LSA system while monitoring the position of the wafer stage WS by the laser interference meter 9 so as to successively scan 9 measurement points (corresponding to the mark regions $MA_1$ to $MA_9$) for each of the shot regions SA by using the spot light of the LSA system. As a result, the main controller MCS detects whether or not there is the resist image at each of the measurement points in the shot region SA. The position of shot region SA on the wafer W and that of each of the measurement points (two pairs of L/S patterns) in the above-described shot regions SA are distinguished in accordance with positional information (the coordinates of the stage) supplied from the laser interference meter 9.

As shown in FIG. 9A, the resist image is left in the shot region (measurement points) under the focus condition which will not cause the film reduction when the wafer W is successively scanned by the spot light SP of the Y-LSA system 10 in the direction Y. Therefore, diffraction light generated from the stepped edge (small projection and pit in the resist layer) of the above-described resist image is received by a photoelectric detector so that the Y-LSA system 10 transmits a photoelectric signal, which corresponds to the intensity of the diffraction light, to the ASC 14. On the other hand, the resist image (the stepped edge) is removed due to the development process in the shot region under the focus condition which will cause the film reduction. Therefore, no diffraction light is generated and the Y-LSA system 10 does not transmit the photoelectric signal. As a result, the existence of the resist image can easily and quickly be detected by examining the existence of the transmitted photoelectric signal SR by using the Y-LSA system 10 and the ASC 14.

According to this embodiment, the formed resist images of the two pairs of the L/S patterns are arranged in the direction Y at each of the measurement points on the wafer W. Therefore, when the measuring point is scanned with the spot light SP by a stage scan method, the two pairs of the resist images respectively generate diffraction light or diffused light. In particular, the diffused light generated from the stepped edge extending in the direction of the spot scanning operation is received by the photoelectric detector so that the Y-LSA system 10 transmits a photoelectric signal $SR_1$ as shown in FIG. 9B. According to this embodiment, the dimensions of the first pattern $RM_1$ are determined so as to make the pattern width d of the resist image of the two pairs and the pattern length 1 to be substantially the same as the beam width BW of the spot light SP. Therefore, the photoelectric signal $SR_1$ has its waveform having two different peak values depending upon only the difference in the length of the stepped edge which extends in the spot scanning direction. As a result, if the waveform of the photoelectric signal $SR_1$ is processed by a predetermined slice level $SL_0$ in the ASC 14, the existence of each of the two pairs of the resist images can be detected in accordance with the existence of the two peak values of the waveform of the photoelectric signal $SR_1$. In the case where the spot light (designated by a dashed line of FIG. 9A) from the X-LSA system is used, each of the existence of the two pairs of the resist images must, of course, be individually detected.

Figure 10:
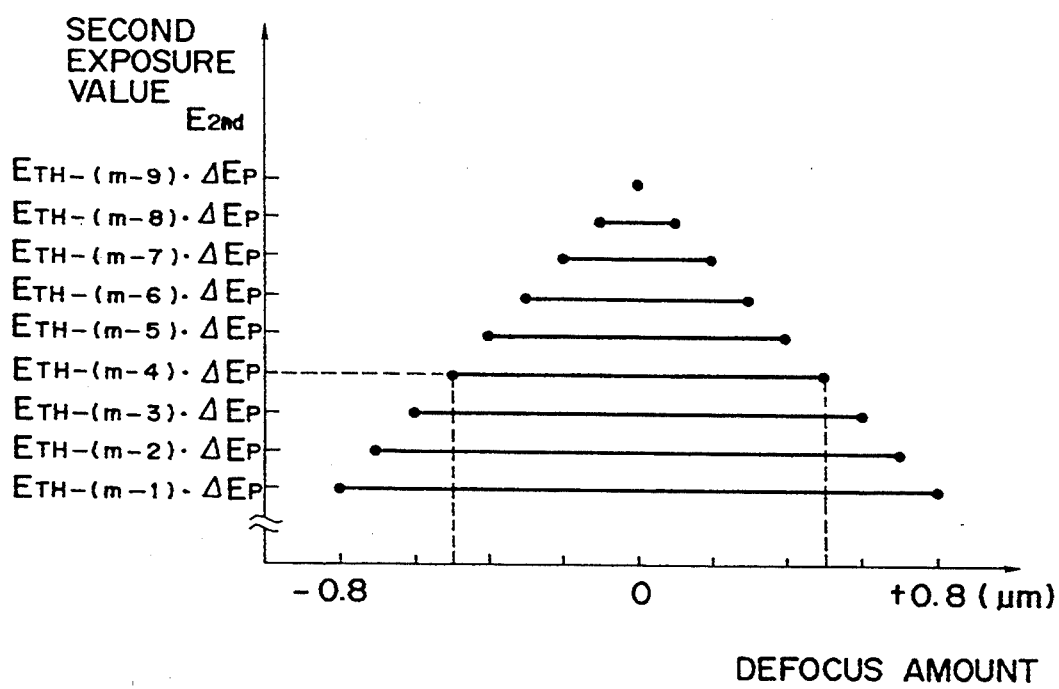
FIG. 10 illustrates a focus range in which the resist image exists depending upon the quantity of the second exposure value.

Now, the relationship between the second exposure value $E_{2nd}$ and the existence of the resist image will be described. In the case where the second exposure value $E_{2nd}$ is $E_{TH}$, the resist image can perfectly be removed from all of the measurement points in the shot region after the development even if that shot region is the region which is exposed at the best focus position. In the case where the second exposure value $E_{2nd}$ is 0, the resist image is, of course, not removed and left at all of the measurement points in the shot region regardless of the focus condition. Therefore, the resist image commences to appear when the second exposure value $E_{2nd}$ becomes a proper value smaller than the exposure value $E_{TH}$. As the second exposure value becomes less than its exposure value, the focus range in which the resist image is left is gradually enlarged. As for the relationship between the focus conditions for the first and second exposure operations and the existence of the resist image, as the defocus amount at the first exposure is reduced, the contrast of the light intensity on the wafer W becomes strong. This means that the solubility of the resist layer (which corresponds to the light shield portion of the first pattern $RM_1$) left after the development becomes the smallest when the defocus amount is 0 μm (best focus). Therefore, in the shot configuration shown in FIG. 8, the resist image is, substantially relative to the best focus position, left in each of the Y directional shot lines which have the different second exposure value $E_{2nd}$. The above-described fact can be understood from FIG. 10 which illustrates the result of the detection of the existence of the resist image by the LSA system. FIG. 10 illustrates the relationship between the exposure condition at the second exposure and the existence of the resist image at a measuring point in the shot region SA. FIG. 10 therefore illustrates the focus range (the defocus amount) in which the resist image exists in each of the second exposure value $E_{2nd}$ at the shot center (which corresponds to the mark region $MA_5$). However, it is assumed in the case shown in FIG. 10 that the resist image of the first pattern $RM_1$ commences to appear when the second exposure value $E_{2nd}$ becomes $E_{TH} - (m-9) \cdot \Delta Ep$.

As described above, according to this embodiment, the second exposure value $E_{2nd}$ is obtained which has the same depth of focus as the depth of focus relating to the film reduction at the shot center which has been previously detected by using FIG. 10. Since the above-described depth of focus is assumed to be 1.0 μm according to this embodiment, the second exposure value $E_{2nd}$ becomes $E_{TH} - (m-4) \cdot \Delta Ep$. Therefore, when the flood exposure is performed at the exposure value of $E_{TH} - (m-4) \cdot \Delta Ep$ at the second exposure, the resist image which has generated the film reduction in the first exposure is left by the development process. Therefore, only the resist image which has not generated the film reduction at the first exposure is not removed and left after the development. Then, a Y-directional shot line which has been subjected to the flood exposure at the second exposure value of $E_{TH} - (m-4) \cdot \Delta Ep$ is selected from the shot configuration shown in FIG. 8. Then, in accordance with the existence of resist image in the shot line (the shot regions $SA_{1\ m-3}$ to $SA_{n\ m-3}$), the focus condition, in which the resist image exists, for each of the measurement points in the shot region SA (which corresponds to the exposure field IF) is obtained. The thus obtained focus range is determined to be the depth of focus of the projection lens PL relating to the film reduction. As a result, the depth of focus relating to the film reduction in the direction of the thickness can be easily detected for the overall region of the exposure field IF. At this time, two depths of focus (in the directions X and Y) relating to the film reduction and corresponding to the two pairs of the L/S patterns of the first pattern $RM_1$ are detected at one measurement point. Therefore, the averaged value of the above-described two obtained values is made to be the depth of the focus for the film reduction at that measurement point. If the number of the measurement points in the exposure field IF, that is, the number of the mark regions in the test reticle TR, is increased, a further precise depth of focus relating to the film reduction can be obtained. As described above, even if the number of the measurement points is increased in the exposure field, it is necessary to detect only the existence of the resist image according to this embodiment. Furthermore, the measurement can be quickly completed by using the LSA system. Therefore, the deterioration in the throughput can be satisfactorily prevented. As a result, the method according to this embodiment is able to exhibit the high speed performance thereof in the case where the number of the measurement points is large. In particular, the present invention is significantly effective if it is applied to a projection lens having a wide exposure field. If the conditions such as the type of the resist or the base material and the film thickness are different, the above-described operation may be repeatedly performed. Therefore, the depth of focus relating to the film reduction in the overall region of the exposure field can easily be obtained under each of the conditions.

According to this embodiment, the existence of the resist image is detected by using the alignment sensor (LSA system) of the stepper. Therefore, the focus condition for the stepper can be automatically set. First, the central value (the focus position) of the depth of focus relating to the film reduction at each of the nine measurement points in the exposure field IF is obtained. The averaged value of the above-described central values is determined to be the best focus position (the best imaging surface). Then, the inclination angle of the parallel plane (omitted from illustration) may be adjusted so as to make the best focus position to be the reference zero point of the AF sensor 12. As a result, the best imaging surface and the surface of the shot region can accurately be aligned to each other at each shot by using the AF sensor 12 at the time of the pattern exposure. Furthermore, according to this embodiment, for example, the field curvature, the field inclination and the astigmatism of the projection lens PL can be obtained in accordance with the depth of focus relating to the film reduction, that is, the limit focus position at which the resist image exists on the infocus side (or the outfocus side).

Figure 11A:
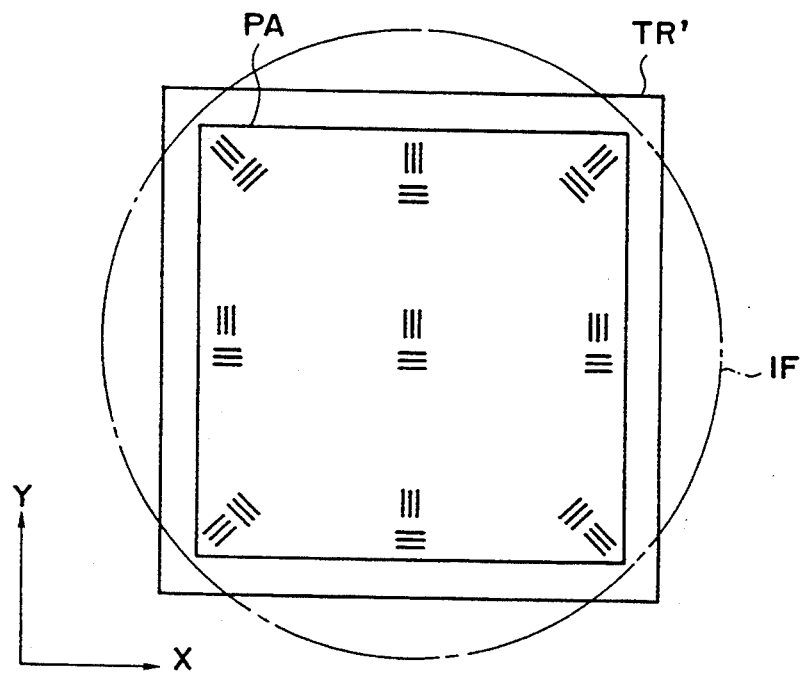

The present invention is not limited to the above-described structure arranged in such a manner that the preferable first pattern $RM_1$ is the L/S pattern shown in FIG. 7B. The necessity lies in that at least one bar pattern is provided regardless of the number, the pitch and the direction of the arrangement. The bar pattern may be replaced by a pattern having a linear mark in at least a portion thereof. FIG. 11 illustrates a modification to the first pattern according to the above-described embodiment. FIG. 11A illustrates a test reticle TR' arranged in such a manner that two pairs of L/S patterns are, as the first pattern, disposed at nine places in the pattern region PA, the two pairs of the L/S patterns being arranged in such a manner that the direction of the pitch of their bar patterns aligns to the sagital direction (direction S) and the meridional direction (direction M) in the exposure field IF. In this case, when the existence of the resist images of the respective L/S patterns arranged in the directions S and M are individually detected, the astigmatism of the projection lens PL can be detected as well as the film reduction depth of focus of the projection lens in the directions S and M.

Figure 11B:
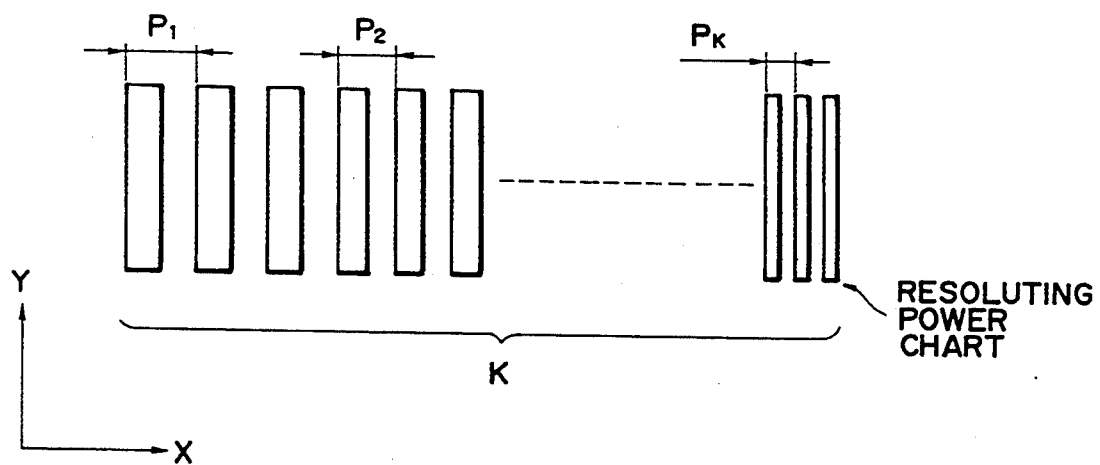

At this time, the depth of focus relating to the film reduction at each of the measurement points is determined in consideration of the astigmatism. Specifically, it is the averaged value of the film reduction depths of focus in the directions S and M. FIG. 11B illustrates a so-called resolving power chart established by a structure composed of the L/S patterns the number of which is k, which are arranged in such a manner that their sizes are arranged to be reduced in the sequential order as pitch P1 to Pk and which includes a bar pattern which is smaller than the designed resolving power of the projection lens PL. In the case where a resolving power chart of the type described above is used, it is possible to measure the depth of focus relating to the film reduction for each of the pitches (line widths) at the same measurement point in the exposure field IF. Furthermore, since the bar pattern which is thinner than the designed resolving power is provided, the actual performance (the resolving power revealed in the process) of the projection lens PL can be determined from the depth of focus relating to the film reduction at the line width. FIG. 11C illustrates an example of the LSA pattern in which the measurement according to this embodiment is preferably automatically performed. Usually, an LSA pattern is arranged in such a manner that a plurality of dot marks (for example, 4×4 $\mu$m on the wafer) are arranged in the lengthwise direction of the spot light SP at a predetermined pitch (8 $\mu$m on the wafer). An LSA pattern RMa is arranged in such a manner that a plurality (it is determined in accordance with the pattern line width, and it is five in this drawing) of bar patterns (4 $\mu$m in length) are arranged in the spot scanning direction at a predetermined pitch. Furthermore, the L/S patterns (which correspond to the above-described dot marks) are arranged perpendicularly to the spot scanning direction at a pitch of 8 $\mu$m. As a result, the accuracy of the LSA system in detecting the resist image can be improved. FIG. 11D illustrates an example of the LSA pattern which is able to preferably detect the depth of focus relating to the film reduction in the direction S (or M). Referring to this drawing, an LSA pattern RMb is arranged in such a manner that the L/S patterns shown in FIG. 11C are arranged so as to align their pitch direction to the direction S (or M).

Figure 12A:
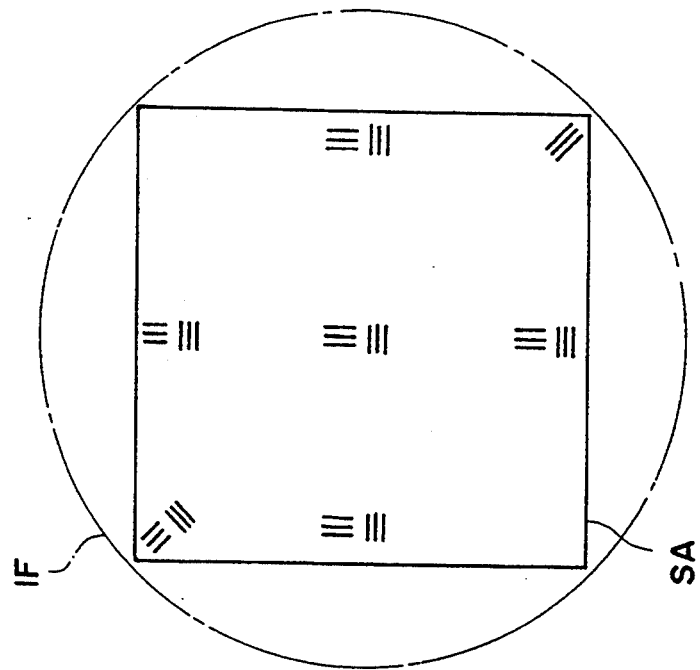
FIGS. 12A and 12B illustrate the state where the resist image is formed in the shot region which has been exposed by a defocus amount of $\pm 0.5$ $\mu$m.
Figure 12B:
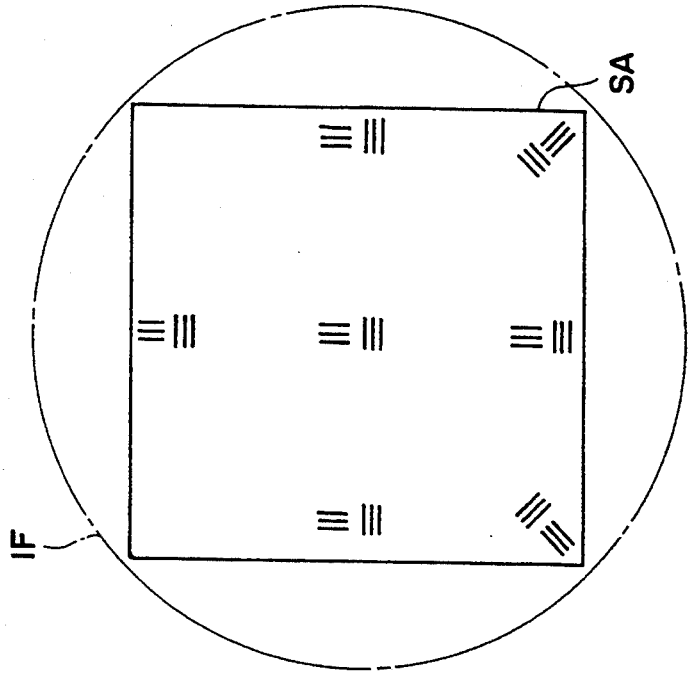

As described above, according to this embodiment, the existence of the resist image is detected in each of all of the shot regions SA (nine measurement points) on the wafer W. However, another structure may be employed which is arranged in such a manner that the existence of the resist image is detected for only the measurement point of the shot center so as to obtain the relationship shown in FIG. 10. As a result, the second exposure value $E_{2nd}$ is determined. Then, some (about two) shot regions SA are selected from the shot line (see FIG. 8) exposed at the above-described second exposure value $E_{2nd}$, the selection being made in accordance with a predetermined depth of focus relating to the film reduction. Then, the existence of the resist image is detected at the residual 8 measurement points in only the selected shot regions SA. Since the above-described depth of focus is 1.0 $\mu$m according to this embodiment, it is preferable that the shot region be selected in which the defocus amount is set to ±0.5 $\mu$m in order to select one focus condition on the infocus side and the outfocus side respectively. FIGS. 12A and 12B illustrate the existence of the resist image in the shot region formed in such a manner that the defocus amount is ±0.5 $\mu$m. As shown in each of these drawings, the resist image is partially cut in the vicinity of the outer portion of the shot region SA (the exposure field IF). Usually, it can be considered that the subject projection lens has the optical performance relating to the film reduction if the resist image exists in all of the measurement points in the exposure field. If the resist image is cut as shown in FIGS. 12A and 12B, it can be considered that the optical performance in the portion in the vicinity of the field is insufficient. As a result, although the actual depth of focus cannot be obtained, the number of the shot regions (measurement points) to be measured can significantly be reduced. Therefore, the optical performance of the projection lens relating to the film reduction can extremely easily be detected (evaluated).

According to this embodiment, the latent image formed on the resist layer due to the first exposure is subjected to the second exposure (flood exposure) so as to detect the existence of the resist image after the development. Thus, the depth of focus of the projection lens PL relating to the film reduction is obtained. However, another structure may be employed which is arranged in such a manner that the second exposure is replaced by an etching process and the etching time which corresponds to the second exposure value $E_{2nd}$ similarly to this embodiment is properly determined. As a result, the depth of focus relating to the film reduction can also be obtained from the existence of the pattern image (base pattern) formed after the etching.

Now, a second embodiment of the present invention will be described, wherein the lithography system (stepper) to which the method according to the present invention can preferably be applied is arranged to have the same structure as that according to the first embodiment (see FIG. 6). Therefore, the description about it is omitted here. According to the first embodiment, the method of measuring the depth of focus of the projection lens relating to the film reduction in the direction of the thickness is described. However, according to this embodiment, the lengthwise film reduction of the resist image due to the defocus, that is, the focus condition relating to the change in the lengthwise directional dimension is measured. First, a principle according to this embodiment will be described with reference to FIGS. 13 and 14 prior to making the measurement method according to this embodiment.

Figure 13A:
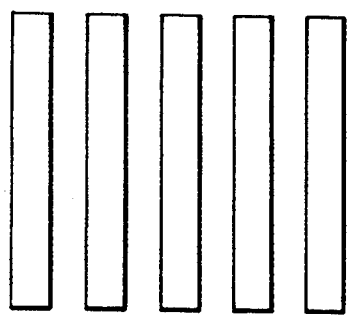
FIGS. 13A to 13C and FIGS. 14A to 14C illustrate the principle of a second embodiment of the present invention.
Figure 13B:
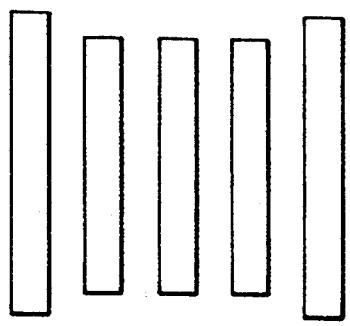
Figure 13C:
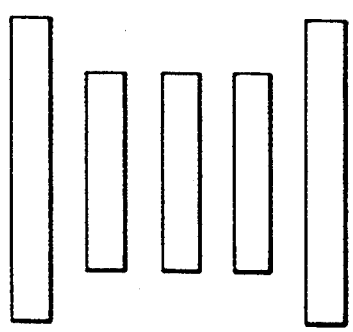
Figure 14A:
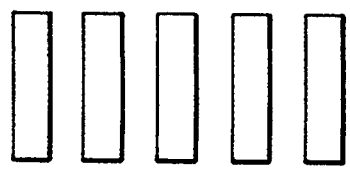
Figure 14B:
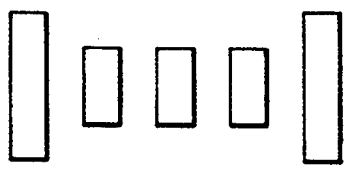
Figure 14C:

FIG. 13 illustrates a resist image formed after the development when the L/S pattern (five bar patterns) is exposed to light at the most suitable exposure value while changing the focus condition. In this case, the focus conditions shown in FIGS. 13A to 13C are determined in such a manner that the defocus amount is 0, +1 and +2 μm respectively. As shown in FIG. 13, five bar patterns are formed in any of the focus conditions. However, the inner three bar patterns except for the two outer bar patterns of the five bar patterns are arranged to have a short lengthwise length. The reason for this lies in that, since each of the three inner bar patterns has other bar patterns on both sides thereof, the contrast of the projected image of the three inner bar patterns rapidly deteriorates at the time of the defocus. Since the two outer bar patterns have no bar pattern on either side thereof (outside), the reduction in the contrast is moderated at the time of the defocus in comparison to the three inner bar patterns. Therefore, lengthwise pattern length of each of the two outer bar patterns is not substantially changed. Thus, it can be understood that the lengthwise dimensional change easily appears in the three inner bar patterns. FIG. 14 illustrates a resist image formed after the development when the L/S pattern is exposed to light under the same exposure condition as that shown in FIG. 13. However, the lengthwise length of the L/S pattern is shortened in comparison to the structure shown in FIG. 13. Similarly to FIGS. 13A and 13B, the structure shown in FIG. 14A is arranged in such a manner that the dimension of each of the five bar patterns is arranged to be the same. The structure shown in FIG. 14C is arranged to be different from that shown in FIG. 13C in that the three inner bar patterns are perfectly removed. That is, in the case where the defocus amount is set to 2 μm, it can be understood that the lengthwise pattern length of the resist image has been changed by a degree exceeding the initial length (the determined L/S pattern length).

As described above, according to this embodiment, the allowable lengthwise dimensional change in the resist image is determined at the time of manufacturing the device. Furthermore, pattern length H ($H = L/\alpha$) of the L/S pattern in the lengthwise direction is properly determined in accordance with allowable value L relating to the length change and reduction rate $\alpha$ of the projection lens PL. As a result, whether or not the pattern length of the resist image has changed by a degree exceeding the allowable value L can be judged depending upon only the existence of the resist image of the L/S pattern.

According to this embodiment, the above-described principle is employed so as to detect the focus condition (to be called the "depth of focus relating to the length change") which causes the lengthwise dimensional change of the resist image to be smaller than the allowable value L from the focus range in which the resist image exists.

Now, the measurement operation according to this embodiment will be described.

Figure 15A:
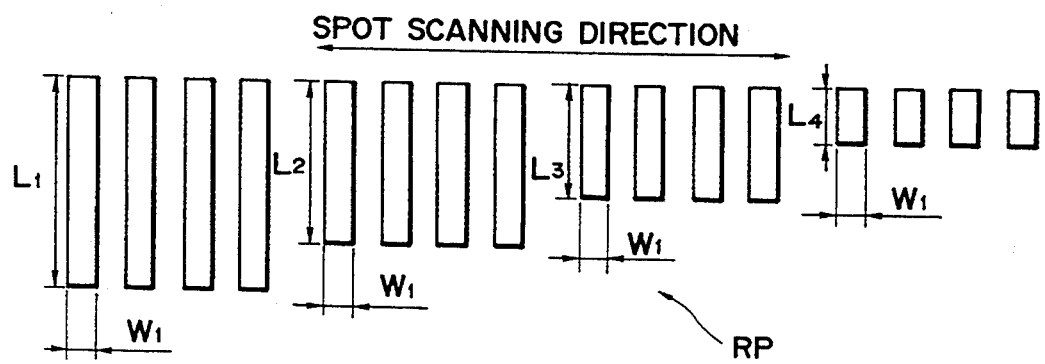
FIGS. 15A and 15B illustrate an example of the shape of a first pattern according to the second embodiment of the present invention.
Figure 15B:
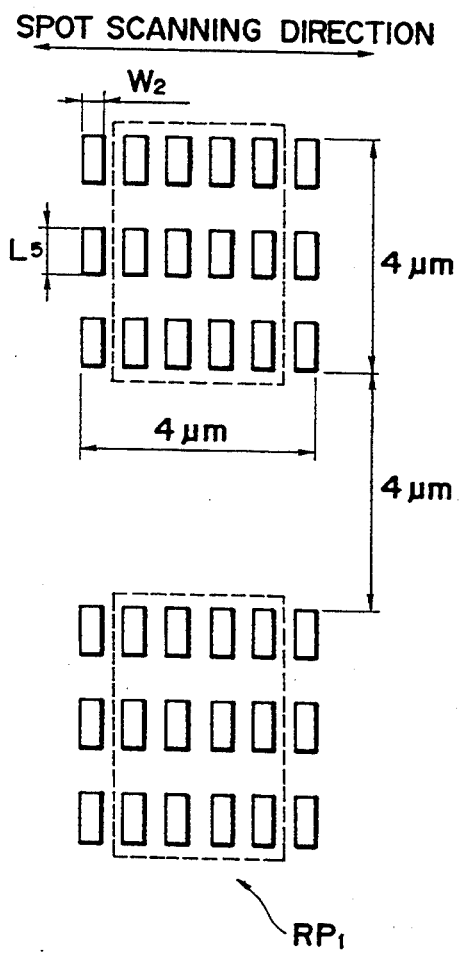

FIGS. 15A and 15B illustrate an example of the shape of the first pattern for use in the measurement according to this embodiment. A first pattern RP shown in FIG. 15A is arranged in such a manner that it comprises four L/S patterns the pattern line width on the wafer of which is $W_1$ and the lengthwise pattern length of which is $L_1$ to $L_4$ respectively. The first pattern RP is arranged in such a manner that each of the lengths $L_1$ to $L_4$ designates its allowable change in the length. Therefore, the depths of focus relating to the change in the length for the four allowable values can be simultaneously detected. Furthermore, if the first pattern is formed by a plurality of line widths, the depths of focus relating to the length change can be detected for each of the line widths. FIG. 15B illustrates an example of the first pattern for use in the measurement by using the LSA system according to this embodiment. The first pattern RP1 is constituted similarly to FIG. 11C, wherein a plurality (which is determined in accordance with line width $W_2$ and which is 6 here) of diffraction grating patterns (4 μm in length) are arranged in the spot scanning direction at a predetermined pitch. Furthermore, thus formed pattern groups are formed perpendicular to the spot scanning direction at a pitch of 8 μm. The first pattern $RP_1$ is arranged in such a manner that the length $L_5$ of the bar pattern which constitutes the diffraction grating pattern is made to be the allowable value relating to the length change. Therefore, the depth of focus relating to the length change which causes the dimensional change to be shorter than $L_5$ can be measured. The pattern line width $W_2$ may be determined to be the value for the depth of focus which is desired to be measured. According to this embodiment, a test reticle is used which is arranged in such a manner that the first pattern $RP_1$ is formed in each of 9 places ($3 \times 3$ configuration) in the pattern region PA.

In the stepper shown in FIG. 6, the main controller MCS is arranged in such a manner that the exposure value is made to be the predetermined most suitable exposure value $E_{1st}$. Furthermore, the projected image of the pattern region of the test reticle is, by using the AF sensor 12, transferred on to the wafer W in the step and repeat method (first exposure) while successively changing only the focus position f by 0.1 $\mu$m. As a result, the latent image of the first pattern $RP_1$ is formed in each of the shot regions SA of the resist layer.

According to this embodiment, the existence of the resist images of the four inner diffraction grating patterns (in the dashed line of FIG. 15B) except for the two end patterns are detected by using the Y-LSA system 10 as described later. At this time, if the two diffraction grating patterns at the two ends (two outer patterns) which show a moderate reduction in the contrast at the time of the pattern exposure are left as the resist images, diffraction light is also generated in the two outer diffraction grating patterns. Therefore, it is impossible to correctly detect the existence of the four inner diffracting grating patterns.

Figure 16A:
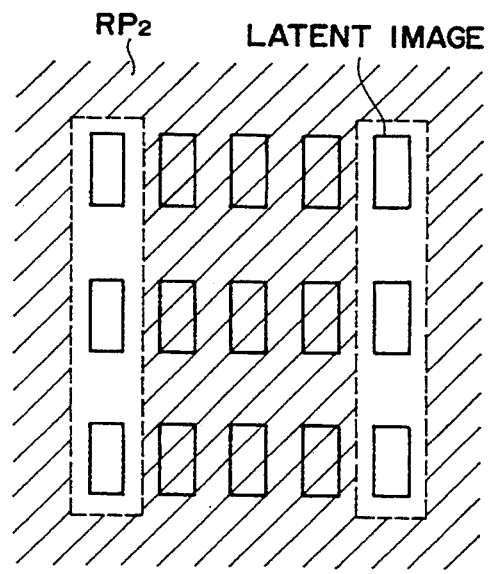

Therefore, according to this embodiment, the two outer diffraction grating patterns are removed by the development process in such a manner that the latent image of the first pattern $RP_1$ formed on the resist layer is subjected to the second exposure (double exposure) after the first exposure. The second exposure may be arranged in such a manner that the focus condition for each of the shot regions is made to be the same as that in the first exposure. Furthermore, only the latent images of the two outer diffraction grating patterns are exposed to light at a proper exposure value (for example, the most suitable exposure value $E_{1st}$) which enables the resist layer to be removed. Therefore, a second pattern $RP_2$ (hatched section) as shown in FIG. 16A is used. As an alternative to this, a variable blind is used which is disposed in the illumination optical system 5 at the conjugation position with the reticle and which is capable of optionally selecting the illumination field of the reticle by changing the aperture position or the shape by opening/closing a movable blade thereof. According to this embodiment, the reticle interchange and the reticle alignment are performed immediately after the first exposure. Then, the overlap exposure (second exposure) of the second pattern $RP_2$ on the latent image of the first pattern $RP_1$ is performed while aligning the projected image of the reticle pattern to the shot region SA.

The wafer W which has been subjected to the double exposure is then subjected to the development by the coater developer before it is again introduced into the stepper in which it is placed on the wafer stage WS. The main controller MCS performs the similar operation as that according to the first embodiment. As a result, it successively scans (see FIG. 16B) the measurement points (the resist image) in the shot region SA by using the Y-LSA system 10 so as to detect the existence of the resist image at the nine measurement points in the shot region. At this time, if the dimension change of the resist image which can be generated in accordance with the defocus amount at the first exposure is smaller than length $L_5$, the resist image is not removed and is left. Therefore, the diffraction light from the resist image can be detected by the Y-LSA system 10. If the dimension change exceeds length $L_5$, the resist layer is removed due to the development process. Therefore, no diffraction light is detected from the wafer W.

Therefore, the main controller MCS detects the existence of the resist image at each of the nine measurement points in the shot region SA in accordance with the existence of the diffraction light from the wafer W, that is, the output (photoelectric signal $SR_2$ shown in FIG. 16C) from the Y-LSA system 10. From the result of this detection, it obtains the focus condition with which the resist image exists in each of the measurement points in the shot region SA (which corresponds to the exposure field IF). The thus obtained focus range is determined to be the depth of focus relating to the length change of the projection lens PL. As a result, the depth of focus relating to the length change (that is, the film reduction in the lengthwise direction of the resist image) in the overall region of the exposure field IF can easily be detected. Furthermore, similarly to the first embodiment, the optical characteristics of the projection lens PL such as the best focus position and the field curvature and the like can be obtained in accordance with the depth of focus relating to the length change.

The first pattern according to this embodiment is not limited to the pattern shown in FIGS. 15A and 15B. It is necessary for the structure to be arranged in such a manner that three or more bar patterns are arranged substantially parallel to one another regardless of the pitch and the direction in consideration of the principle of this embodiment. Furthermore, according to this embodiment, only the latent images of the two outer diffraction patterns are subjected to the double exposure at the second exposure in consideration of the accuracy (intensity of the diffraction light) in the detection of the existence of the resist image. However, the necessity according to this embodiment lies in that the existence is detected for at least one bar pattern of the residual bar patterns except for the two end bar patterns among the resist images (a plurality of bar patterns). Therefore, it is necessary that the exposure is performed in such a manner that at least one bar pattern (latent image) is shielded at the second exposure.

Now, a modification to this embodiment will briefly be described with reference to FIG. 17. The difference from the second embodiment lies in only the first pattern. According to this modification, a first pattern $RP_1'$ as shown in FIG. 17A that is, an L/S pattern arranged in such a manner that the lengthwise direction of the bar pattern is arranged in the spot scanning direction on the wafer W is used. First, the first pattern $RP_1'$ and a second pattern $RP_2'$ (hatched section) shown in FIG. 17B are used so as to perform the double exposure similarly to the second embodiment. Then, the main controller MCS successively scans (see FIG. 17C) the measurement points in the shot region SA by using the Y-LSA system 10. It then detects the existence of photoelectric signal $SR_3$ at the measurement points in accordance with the output (the existence of the photoelectric signal $SR_3$ shown in FIG. 17D) from the Y-LSA system 10. From the result of this detection, the focus condition with which the resist image exists at each of the measurement points in the shot region SA is obtained. Then, the thus obtained focus range is determined to be the depth of focus of the projection lens PL relating to the length change.

As for the resist image of the first pattern $RP_1'$ (the three inner bar patterns) the dimension change of which due to the defocus is within the allowable value, the resist image exists on the wafer, and the length of the resist image in the lengthwise direction (in the spot scanning direction) can be obtained by processing the waveform of the photoelectric signal $SR_3$ shown in FIG. 17D in the ASC 14 at a predetermined slice level SL- Therefore, the quantity of change in the length of the bar pattern can be accurately calculated in accordance with the above-described measured length and the designed length of the bar pattern. A structure may be employed in which the length of the bar pattern is arranged to be relatively longer than the change in the length (estimated value) and the quantity of the change in the bar pattern length is obtained by the above-described waveform process. As a result, the necessity of using, for example, the first pattern RP shown in FIG. 15A can be eliminated because the focus condition with which the change in the dimension of the resist image is smaller than the allowable value relating to the change in the length, that is, the depth of focus relating to the length change for each of the allowable values which can be optionally determined can easily be calculated in accordance with the quantity of the change in the length of the bar pattern. Furthermore, in the case in which a bar pattern of the type described above is used, the focus condition with which no dimension change of the resist image occurs can also be detected.

In order to accurately detect the existence of the resist image, the two outer diffraction grating patterns are removed by the second exposure. The second exposure may be omitted from the shot, considering that the three inner bar patterns are shorter than the two outer bar patterns. In this case, photoelectric signal $SR_4$ (see FIG. 17F) supplied from the Y-LSA system 10 is caused to have a waveform synthesized by the photoelectric signal which corresponds to the intensity of the diffraction light supplied from the two outer bar patterns and the photoelectric signal which corresponds to the intensity of the diffraction light supplied from the three inner bar patterns. Therefore, when the waveform of the photoelectric signal $SR_4$ is processed in the ASC 14, the necessity of performing the second exposure can be eliminated if, for example, two slice levels $SL_1$ and $SL_2$ are provided as shown in FIG. 17F. In this case, the existence of the resist image or the quantity of the change in the length of the resist image can also be obtained.

As described above, according to the first and the second embodiments, the test reticle is used. However, if, for example, a device reticle and a variable blind (omitted from illustration) are employed, the test reticle can be omitted from the structure. In this case, a structure may be employed in which a portion (or the reticle mark for the alignment) of the device pattern is transferred at the first exposure and the light transmissive portion in the pattern region PA is utilized at the second exposure. As described above, the first patterns $RM_1$ and $RP_1$ are not limited to the arrangement direction of the bar pattern (or the L/S pattern) in the exposure field IF. As is also shown from this, there arises no necessity in that the arrangement direction of the resist image (L/S pattern) and the lengthwise direction of the spot light are always aligned to each other on the wafer W. For example, the relationship shown in FIGS. 18A to 18C may be employed. FIG. 18A illustrates a case where the spot light SP is inclined with respect to the spot scanning direction by for example 45°, FIG. 18B illustrates a case where the resist image is inclined with respect to the spot scanning direction and FIG. 18C illustrates a case where both the spot light SP and the resist image are inclined with the spot scanning direction.

Now, a third embodiment of the present invention will be described. According to this embodiment, the first pattern $RP_1'$ shown in FIG. 17A is employed, the first pattern $RP_1'$ having the bar pattern the length $L_6$ of which is, as described in the second embodiment, relatively longer than the quantity of the length changed (estimated value) due to the defocus.

The main controller MCS of the stepper shown in FIG. 6 performs, similarly to the first embodiment, the first exposure (the pattern exposure) and the second exposure (the flood exposure). Furthermore, it performs a third exposure in such a manner that the second pattern $RP_2'$ (see FIG. 17B) is made to overlap the latent image of the first pattern $RP_1'$ formed on the resist layer due to the above-described double exposure. The third exposure is performed for the purpose of preventing the deterioration in the accuracy in detecting the existence of the resist image (three inner bar patterns), the deterioration being caused by the bar patterns on the two sides. The third exposure is arranged to be performed similarly to the second embodiment. The focus conditions for the first to the third exposures are arranged to be the same for each of the shot regions. According to this embodiment, the focus position is successively shifted in the direction Z by 0.1 μm. The wafer W, which has been developed by the coater developer, is again conveyed to the stepper before it is placed on the wafer stage WS. The main controller MCS, similarly to the first embodiment, successively scans the measurement points in the shot region by using the Y-LSA system 10 so as to detect the existence of the resist image at each of the nine measurement points in the shot region. Then, it determines the focus range in which the resist image exists to be the depth of focus relating to the film reduction in the direction of the thickness.

At this time, the main controller MCS determines the existence of the resist image so as to obtain the depth of focus relating to the film reduction. Simultaneously, it causes the ACS 14 to process the waveform of the photoelectric signal $SR_4$ (see FIG. 17F) supplied from the Y-LSA system 10 so as to obtain the length of the resist image in the lengthwise direction (the spot scanning direction). Therefore, the quantity of the change in the length of the bar pattern in the lengthwise direction of the resist image can be accurately calculated, the resist image being the resist image which is left since it is not removed after the development, that is, the resist image which does not encounter the film reduction in the direction of the thickness. Furthermore, the depth of focus relating to the length change with which the dimension change is smaller than the allowable value L can be determined in accordance with the quantity of the length change.

In this case, the quantity of the change in the length of the bar pattern of only the resist image which exists on the wafer, that is, the resist image within the film reduction depth of focus is measured. Therefore, an accurate depth of focus relating to the length change can be obtained only in the case where the quantity of the change in the length of the resist image exceeds the allowable value $L_6$, that is, only in the case where the relationship (the depth of focus relating to the film reduction)>(the depth of focus relating to the length change) is held. In the case where the quantity of the change in the length of the resist image is smaller than the allowable value $L_6$, the depth of focus relating to the length change cannot be accurately obtained but only the relationship (the depth of focus relating to the film reduction)≦(the depth of focus relating to the length change) is obtained.

Therefore, when the focus condition of the stepper is automatically set according to this embodiment, the best focus position is determined by using the depth of focus relating to the length change in the former case. On the other hand, the depth of focus relating to the film reduction is used in the latter case. The calibration of the AF sensor 12 is performed from the thus obtained best focus position so that the best imaging surface and the surface of the shot region accurately coincide at each of the shots.

According to this embodiment, the quantity of the change in the length of the resist image existing on the wafer W is obtained by using the LSA system. Therefore, there arises a necessity of using the first pattern $RP_1'$ formed in such a manner that its lengthwise direction of the bar pattern thereof coincides with the spot scanning direction on the wafer. However, in the case where an alignment sensor except for the LSA system, for example, the FIA system 13 is used, the quantity of the change in the length of the resist image can be calculated regardless of the fact that the spot scanning direction coincides with the lengthwise direction of the bar pattern. Therefore, the present invention is not limited to the first pattern $RP_1'$ according to this embodiment. The necessity lies in that the pattern can be used in at least the second embodiment. As described in the modification to the second embodiment, in the case where the dimensional change of the resist image is large, the waveform of the photoelectric signal transmitted from the LSA system may be processed. As a result, the exposure (the third exposure) for removing the two outer bar patterns can be omitted from the structure according to this embodiment.

Figure 19:
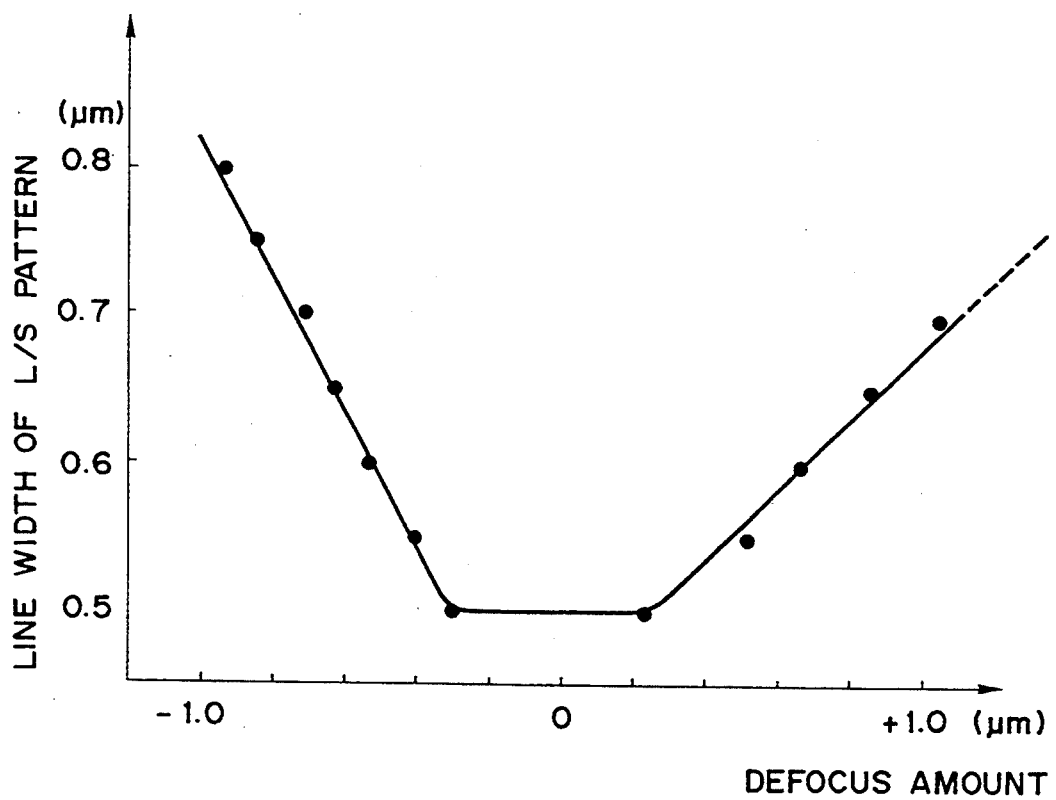
FIG. 19 illustrates an example of the depth of focus relating to the film reduction for each of the line widths of the L/S pattern.

According to any of the first to the third embodiments of the present invention, each of the plurality of L/S patterns having different line widths is transferred to the surface of the wafer W. At this time, one L/S pattern is exposed while changing the focus condition in the first exposure before the next L/S pattern is exposed while newly changing the focus condition. Then, similarly to the above-described embodiments, the depth of focus relating to the film reduction (or the length change) for each of the line widths (the L/S pattern) is determined in accordance with the existence of the resist image. As a result, the relationship shown in FIG. 19 is obtained. Referring to FIG. 19, the axis of ordinate stands for the line width of the L/S pattern, while the axis of abscissa stands for the depth of focus (the defocus amount) relating to the film reduction.

As can be clearly seen from FIG. 19, the line width of the L/S pattern is usually reduced in proportion to the depth of focus relating to the film reduction. According to the embodiments of the present invention, the exposure is performed in such a manner that the focus position is successively shifted by 0.1 μm by using the AF sensor 12. If the measurement accuracy (resolution) revealed by the AF sensor 12 is unsatisfactory, the focus position cannot be successively shifted by 0.1 μm. Therefore, the quantity of one shift is inevitably made to be about 0.2 to 0.3 μm.

In the case where the film reduction depth of focus is in inverse proportion to the line width as a result of a comparison made about the film reduction depths of focus of two optional line widths, that is, in the case where the graph (the curve) shown in FIG. 19 is not monotonously decreased (or monotonously increased), it can be understood that the setting of the quantity of the shift of the focus position has not been performed accurately by the AF sensor 12. That is, the measurement accuracy realized by the AF sensor 12 can easily be checked by obtaining the relationship shown in FIG. 19o At this time, the above-described relationship (see FIG. 19) can be accurately obtained by using a highly sensitive resist. Furthermore, the accuracy in checking revealed by the AF sensor can relatively be improved. The measurement accuracy is also checked by using an air micrometer or the like as an alternative to the AF sensor 12.

As described above, according to the first to the third embodiments, the LSA system is employed as the alignment sensor for detecting the existence of the resist image. However, the present invention is not limited to the LSA system and the alignment sensor of the stepper serving as the apparatus according to this embodiment. Any apparatus can be employed if it is able to detect the existence of the resist image. For example, a dye-by-dye alignment system of a TTR (Through The Reticle) system arranged in such a manner that the reticle mark and the wafer mark are overlapped via the projection lens PLS so as to simultaneously observe them may be employed. An image processing method may also be employed in which the wafer mark is observed by an imaging device such as an ITV and CCD cameras. As an alternative to this, a spot scanning system in which a vibration mirror such as the galvanomirror is used may be employed. A wafer alignment system (the FIA system 13 or the like) of an off axis system in which a diffraction light (or diffused light) detection method in accordance with the stage scan (LSA) system is employed may be used. Furthermore, a heterodyne (or homodyne) alignment sensor arranged as disclosed in Japanese Patent Laid-Open No. 63-283129 (corresponds to U.S. Ser. No. 192,784 filed on May 10, 1988) may be used, that sensor being arranged in such a manner that two parallel laser beams are applied to the diffraction grating pattern from two directions so as to form a monodimensional interference fringe. Then, ±1-order diffraction light (interference light) generated from the mark is photoelectrically detected. In addition, a slit scan method which is one of photoelectric measurement methods may be employed. Furthermore, an inspection device such as a small dimension measurement device which employs a reflection light (or diffused light) detection method in which laser scanning is performed may be used. As an alternative to this, a microscope or an image processing measuring device such as an image processing device utilizing He—Ne or He—Cd laser beam may be employed.

Figure 20A:
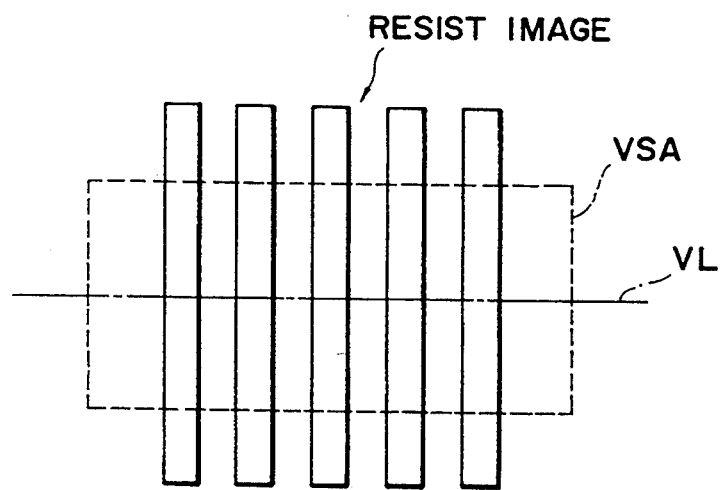
FIGS. 20A, 20B, 21A and 21B illustrate the operation for detecting the existence of the resist image by using an FIA system.
Figure 20B:
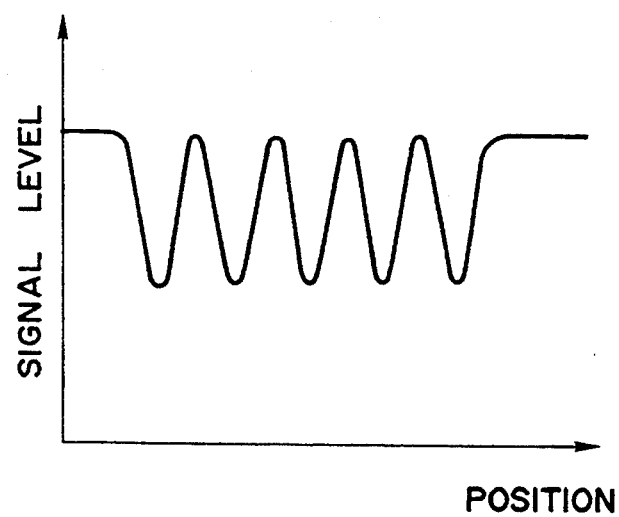
Figure 21A:
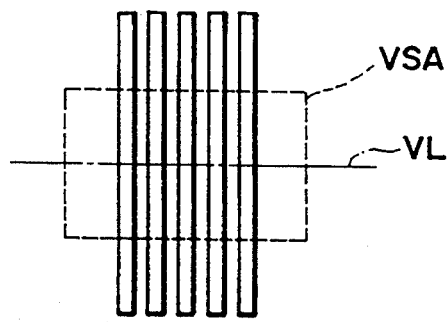
Figure 21B:
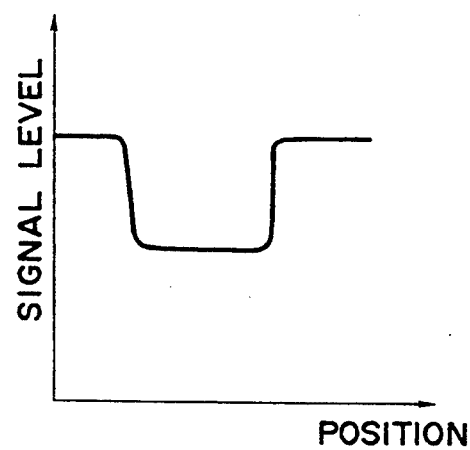

For example, the imaging device of the FIA system 13 electrically scans the resist image along scanning line VL so that an image signal denoting the resist image is transmitted to the ASC 14. Therefore, the existence of the resist image can be detected by examining the existence of the transmitted image signal similarly to the LSA system. In the case (see FIG. 20A) where the line width of the resist image is sufficiently larger than the resolution of the measurement device, the image signal transmitted from the imaging device comes to have the waveform as shown in FIG. 20B. Therefore, the bar patterns are recognized as the individual lines. In the case where the line width is, as shown in FIG. 21A, the same or smaller than the resolution of the measurement device, the measurement light is not returned from the resist image. Therefore, the bar patterns are not recognized as the individual lines. However, the image signal from the imaging device has the waveform (thick dark portion) as shown in FIG. 21B in the above-described case. Therefore, the resist image can be recognized as dark line groups. Therefore, it can be understood that the existence of the resist image can be detected if the FIA system 13 is used. In the case where only the existence of the resist image is detected, the number of the scanning lines may be arranged to be one. However, when the length of the resist image is measured according to the second and the third embodiments, the structure having only one scanning line VL is disadvantageous in terms of the S/N ratio. Therefore, it is preferable that a structure be employed which is arranged in such a manner that the levels of the image signals obtainable from a plurality of horizontal scanning lines introduced in the video sampling region VSA designated by a dashed line are vertically averaged for each of the pixels positioned on the same position in the horizontal direction.

Although the stepper the exposure light source of which is g-ray and i-ray is employed according to this embodiment, the present invention can be applied to the following steppers the exposure light source of which is arranged to be Deep UV light such as KrF Excimer laser light (wavelength: 248 nm), metal vapor laser, dye laser, their higher harmonic wave, higher harmonic wave of YAG laser, or a plurality of wavelengths (for example, g-ray and h-ray). Furthermore, it can be applied to an exposure device of a projection system or a step and scan system and an X-ray exposure device. The present invention can be applied to all of the lithography devices which must have the determined focus condition. In any of the above-described structures, a similar effect can be obtained.

Although the invention has been described in its preferred form with a certain degree of particularly, it is understood that the present disclosure of the preferred form may be changed in the details of construction and the combination and arrangement of parts may be resorted to without departing from the spirit and the scope of the invention as hereinafter claimed.

What is claimed is:

1. A method of determining a focus condition of a projection optical system for use in an apparatus for exposing a photoresist layer formed on a surface of a substrate by projecting an image of a mask with the projection optical system, the method comprising:
    a) a first exposure step of successively exposing a plurality of regions on the photoresist layer through a mask having a pattern, wherein positions of the substrate in a direction of an optical axis of the projection optical system are varied for each of the regions;
    b) a second exposure step of irradiating each of said plurality of regions, in which latent images of said pattern have been formed through the first exposure step, with an energy beam so as to supply a predetermined exposure dose to all of the surface of each region;
    c) a step of developing said photoresist layer on the substrate; and
    d) a step of determining a focus condition of said projection optical system based on a state of a pattern image formed through the developing step.

2. A method according to claim 1, wherein intensity of the energy in said second exposure step is set in such a way that, after the developing step, a pattern remains on said substrate in the regions at which a defocus amount of a corresponding image is within a predetermined range, and does not remain in the regions at which a defocus amount of a corresponding image is outside of said predetermined range.

3. A method according to claim 2, wherein said focus condition of said projection optical system is determined based on presence or absence of a pattern on said substrate after the developing step.

4. A method according to claim 2, wherein said mask has a grating pattern used in said first exposure step and a light transmission opening, and wherein said energy beam used in said second exposure step is radiated onto each of said plurality of regions through the light transmission opening on said mask.

5. A method of evaluating a focus condition of a projection optical system for use in an apparatus for exposing a photoresist layer formed on a surface of a substrate by projecting an image of a mask with the projection optical system, the method comprising:
    a) a first exposure step of exposing under a predetermined focus state each of a plurality of regions on the photoresist layer through a mask having a pattern;
    b) a second exposure step of irradiating each of said plurality of regions, in which latent images of said pattern have been formed through the first exposure step, with an energy beam so as to supply a predetermined exposure dose to all of the surface of each region, wherein said exposure dose is varied for each of said regions;
    c) a step of developing said photoresist layer on the substrate; and
    d) a step of evaluating a focus condition of said projection optical system based on a state of a pattern image formed through the developing step.

6. A method according to claim 5, wherein said mask has a grating pattern used in said first exposure step and a light transmission opening, and wherein said energy beam used in said second exposure step is radiated onto each of said plurality of regions through the light transmission opening on said mask.

7. A method of determining a focus condition of a projection optical system for use in an apparatus for exposing a photoresist layer formed on a surface of a substrate by projecting an image of a mask with the projection optical system, the method comprising:
    a) a first exposure step of successively exposing a plurality of regions arranged as a matrix on the photoresist layer through a mask having a pattern, wherein positions of the substrate in a direction of an optical axis of the projection optical system are varied for each of regions arranged in a first direction of the matrix;
    b) a second exposure step of irradiating each of said plurality of regions, in which latent images of said pattern have been formed through the first exposure step, with an energy beam so as to supply a predetermined exposure dose to all of the surface of each region, wherein said exposure dose is varied for each of regions arranged in a second direction of the matrix;

c) a step of developing said photoresist layer on the substrate; and d) a step of determining a focus condition of said projection optical system based on a pattern image formed through the developing step.

8. A method of determining a focus condition of a projection optical system for use in an apparatus for exposing a photoresist layer formed on a surface of a substrate by projecting an image of a mask with the projection optical system, the method comprising:

a) a first exposure step of successively exposing a plurality of regions on the photoresist layer through a mask having a pattern comprising at least three bars extending in substantially a same direction, wherein positions of the substrate in a direction of an optical axis of the projection optical system are varied for each of the regions;

b) a second exposure step of irradiating with an energy beam latent images, which have been formed through said first exposure step, of only two of said bars positioned at opposite sides of said pattern, for each of said regions;

c) a step of developing said photoresist layer on the substrate; and d) a step of determining a focus condition of said projection optical system based on a state of a pattern image formed through the developing step.

9. A method according to claim 8, wherein a light intensity in said second exposure step is set in such a way that images of both of said two bars positioned at opposite sides of the pattern are absent after the developing step.

10. A method according to claim 8, wherein said focus condition of said projection optical system is determined based on presence or absence of a pattern image on said substrate after the developing step.

11. A method according to claim 8, wherein a latent image of at least one of said bars other than said two bars is shielded during said second exposure step.

12. A method of determining a focus condition of a projection optical system for use in an apparatus for exposing a photoresist layer formed on a surface of a substrate by projecting an image of a mask with the projection optical system, the method comprising:

a) a first exposure step of successively exposing a plurality of regions on the photoresist layer through a mask having a pattern comprising at least three bars extending in substantially a same direction, wherein positions of the substrate in a direction of an optical axis of the projection optical system are varied for each of the regions;

b) a second exposure step of irradiating each of said plurality of regions, in which latent images of said pattern have been formed through the first exposure step, with an energy beam so as to supply a predetermined exposure dose to all of the surface of each region c) a third exposure step of irradiating with an energy beam latent images, which have been formed through said first and second exposure steps, of only two of said bars positioned at opposite sides of the pattern, for each of said regions;

d) a step of developing said photoresist layer on the substrate; and e) a step of determining a focus condition of said projection optical system based on a state of a pattern image formed through the developing step.

* * * * *